(12) United States Patent
Shimizu et al.

(10) Patent No.: US 10,096,770 B2
(45) Date of Patent: Oct. 9, 2018

(54) MAGNETIC MEMORY DEVICE AND METHOD FOR MANUFACTURING THE SAME

(71) Applicant: Kabushiki Kaisha Toshiba, Minato-ku (JP)

(72) Inventors: Mariko Shimizu, Nerima (JP); Yuichi Ohsawa, Yokohama (JP); Hiroaki Yoda, Kawasaki (JP); Hideyuki Sugiyama, Kawasaki (JP); Satoshi Shirotori, Yokohama (JP); Altansargai Buyandalai, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/448,892

(22) Filed: Mar. 3, 2017

(65) Prior Publication Data
US 2018/0040812 A1 Feb. 8, 2018

(30) Foreign Application Priority Data
Aug. 4, 2016 (JP) ................. 2016-154039

(51) Int. Cl.
*G11C 11/00* (2006.01)
*H01L 43/08* (2006.01)
(Continued)

(52) U.S. Cl.
CPC ............ *H01L 43/08* (2013.01); *G11C 11/161* (2013.01); *G11C 11/1675* (2013.01);
(Continued)

(58) Field of Classification Search
CPC ....... H01L 43/08; H01L 27/228; H01L 43/02; G11C 11/161; G11C 11/1675
(Continued)

(56) References Cited

U.S. PATENT DOCUMENTS

| 8,350,347 B2 | 1/2013 | Gaudin et al. |
| 9,218,864 B1 | 12/2015 | Yi et al. |

(Continued)

FOREIGN PATENT DOCUMENTS

| JP | 2013-533636 | 8/2013 |
| JP | 2014-45196 | 3/2014 |

(Continued)

*Primary Examiner* — Huan Hoang
(74) *Attorney, Agent, or Firm* — Oblon, McClelland, Maier & Neustadt, L.L.P.

(57) ABSTRACT

According to one embodiment, a magnetic memory device includes a metal-containing layer, a first magnetic layer, a second magnetic layer, a first intermediate layer, a third magnetic layer, a fourth magnetic layer, a second intermediate layer, and a controller. The metal-containing layer includes first, second, third, fourth, and fifth portions. The first magnetic layer is separated from the third portion. The second magnetic layer is provided between the first magnetic layer and a portion of the third portion. The first intermediate layer includes a portion provided between the first and second magnetic layers. The third magnetic layer is separated from the fourth portion. The fourth magnetic layer is provided between the third magnetic layer and a portion of the fourth portion. The second intermediate layer includes a portion provided between the third and fourth magnetic layers. The controller is electrically connected with the first portion and the second portion.

21 Claims, 16 Drawing Sheets

(51) Int. Cl.
 *G11C 11/16* (2006.01)
 *H01L 27/22* (2006.01)
 *H01L 43/02* (2006.01)
 *H01L 43/12* (2006.01)

(52) U.S. Cl.
 CPC ............ *H01L 27/228* (2013.01); *H01L 43/02* (2013.01); *H01L 43/12* (2013.01)

(58) Field of Classification Search
 USPC ......................................................... 365/158
 See application file for complete search history.

(56) References Cited

U.S. PATENT DOCUMENTS

| 2012/0286339 | A1* | 11/2012 | Asao .................... H01L 27/228 257/295 |
| 2014/0056060 | A1 | 2/2014 | Khvalkovskiy et al. |
| 2014/0269035 | A1 | 9/2014 | Manipatruni et al. |
| 2016/0142012 | A1 | 5/2016 | Wang et al. |
| 2017/0117323 | A1 | 4/2017 | Braganca et al. |

FOREIGN PATENT DOCUMENTS

| JP | 2016-517165 | 6/2016 |
| JP | 2017-112358 A | 6/2017 |

* cited by examiner

MAGNETIC MEMORY DEVICE AND METHOD FOR MANUFACTURING THE SAME

CROSS-REFERENCE TO RELATED APPLICATIONS

This application is based upon and claims the benefit of priority from Japanese Patent Application No. 2016-154039, filed on Aug. 4, 2016; the entire contents of which are incorporated herein by reference.

FIELD

Embodiments described herein relate generally to a magnetic memory device and a method for manufacturing the same.

BACKGROUND

It is desirable to increase the bit density of a magnetic memory device.

DETAILED DESCRIPTION

Figure 1A:
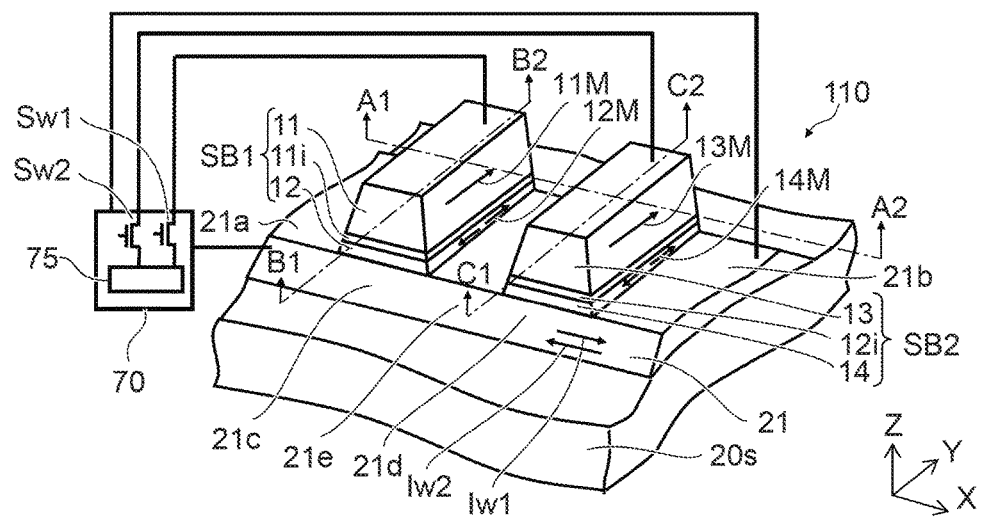
FIG. 1A to FIG. 1D are schematic views illustrating a magnetic memory device according to a first embodiment.

According to one embodiment, a magnetic memory device includes a metal-containing layer, a first magnetic layer, a second magnetic layer, a first intermediate layer, a third magnetic layer, a fourth magnetic layer, a second intermediate layer, and a controller. The metal-containing layer includes a first portion, a second portion, a third portion located between the first portion and the second portion, a fourth portion located between the third portion and the second portion, and a fifth portion located between the third portion and the fourth portion. The first magnetic layer is separated from the third portion in a first direction crossing a second direction. The second direction is from the first portion toward the second portion. The second magnetic layer is provided between the first magnetic layer and a portion of the third portion. The first intermediate layer includes a portion provided between the first magnetic layer and the second magnetic layer. The first intermediate layer is nonmagnetic. The third magnetic layer is separated from the fourth portion in the first direction. The fourth magnetic layer is provided between the third magnetic layer and a portion of the fourth portion. The second intermediate layer includes a portion provided between the third magnetic layer and the fourth magnetic layer. The second intermediate layer is nonmagnetic. The controller is electrically connected with the first portion and the second portion. A length along a third direction of the third portion is longer than a length along the third direction of the second magnetic layer. The third direction crosses a plane including the first direction and the second direction. The length along the third direction of the third portion is longer than a length along the third direction of the fifth portion. The controller is configured to implement a first program operation of supplying a first program current from the first portion toward the second portion, and a second program operation of supplying a second program current from the second portion toward the first portion. A first electrical resistance between the first magnetic layer and the first portion after the first program operation is different from a second electrical resistance between the first magnetic layer and the first portion after the second program operation.

According to another embodiment, a magnetic memory device includes a metal-containing layer, a first magnetic layer, a second magnetic layer, a first intermediate layer, and a controller. The metal-containing layer includes a first portion, a second portion, and a third portion located between the first portion and the second portion. The first magnetic layer is separated from the third portion in a first direction crossing a second direction. The second direction is from the first portion toward the second portion. The second magnetic layer is provided between the first magnetic layer and a portion of the third portion. The first intermediate layer includes a portion provided between the first magnetic layer and the second magnetic layer. The first intermediate layer is nonmagnetic. The controller is electrically connected with the first portion and the second portion. A length along a third direction of the third portion is longer than a length along the third direction of the second magnetic layer. The third direction crosses a plane including the first direction and the second direction. The length along the third direction of the third portion is longer than a length along the third direction of a portion between the third portion and the second portion. The controller is configured to implement a first program operation of supplying a first program current from the first portion toward the second portion, and a second program operation of supplying a second program current from the second portion toward the first portion. A first electrical resistance between the first magnetic layer and one of the first portion or the second portion after the first program operation is different from a second electrical resistance between the first magnetic layer and the one of the first portion or the second portion after the second program operation.

According to another embodiment, a magnetic memory device includes a metal-containing layer, a first magnetic layer, a second magnetic layer, a first intermediate layer, and a controller. The metal-containing layer includes a first portion, a second portion, and a third portion located between the first portion and the second portion. The first magnetic layer is separated from the third portion in a first direction crossing a second direction. The second direction is from the first portion toward the second portion. The second magnetic layer is provided between the first magnetic layer and a portion of the third portion. The first intermediate layer includes a portion provided between the first magnetic layer and the second magnetic layer. The first intermediate layer is nonmagnetic. The controller is electrically connected with the first portion and the second portion. The third portion includes a first overlap region overlapping the second magnetic layer in the first direction, and a first non-overlap region not overlapping the second magnetic layer in the first direction. A thickness along the first direction of at least a portion of the first non-overlap region is thinner than a first overlap region thickness along the first direction of the first overlap region. The controller is configured to implement a first program operation of supplying a first program current from the first portion toward the second portion, and a second program operation of supplying a second program current from the second portion toward the first portion. A first electrical resistance between the first magnetic layer and the first portion after the first program operation is different from a second electrical resistance between the first magnetic layer and the first portion after the second program operation.

According to another embodiment, a magnetic memory device includes a first metal-containing layer, a second metal-containing layer, a plurality of first stacked bodies, a plurality of second stacked bodies, a third stacked body, and a controller. The first metal-containing layer includes a first portion, a second portion, and a first intervening portion provided between the first portion and the second portion. The second metal-containing layer includes a third portion, a fourth portion, and a second intervening portion provided between the third portion and the fourth portion. The second portion is provided between the first portion and the fourth portion. The third portion is provided between the second portion and the fourth portion. The plurality of first stacked bodies are arranged along the first metal-containing layer. One of the first stacked bodies includes a first magnetic layer, a second magnetic layer, and a first intermediate layer. The first magnetic layer is separated from the first intervening portion in a first direction crossing a second direction. The second direction is from the first portion toward the second portion. The second magnetic layer is provided between the first intervening portion and the first magnetic layer. The first intermediate layer is nonmagnetic and includes a portion provided between the first magnetic layer and the second magnetic layer. The plurality of second stacked bodies are arranged along the second metal-containing layer. One of the second stacked bodies includes a third magnetic layer, a fourth magnetic layer, and a second intermediate layer. The third magnetic layer is separated from the second intervening portion in the first direction. The fourth magnetic layer is provided between the second intervening portion and the third magnetic layer. The second intermediate layer is nonmagnetic and includes a portion provided between the third magnetic layer and the fourth magnetic layer. The third stacked body includes a fifth magnetic layer and is provided between the plurality of first stacked bodies and the plurality of second stacked bodies. The controller is electrically connected with the first to fourth portions, the plurality of first stacked bodies, and the plurality of second stacked bodies. The controller is configured to implement a first program operation of supplying, to the first metal-containing layer, a first program current from the first portion toward the second portion, and a second program operation of supplying, to the first metal-containing layer, a second program current from the second portion toward the first portion. A first electrical resistance between the first magnetic layer and one of the first portion or the second portion after the first program operation is different from a second electrical resistance between the first magnetic layer and the one of the first portion or the second portion after the second program operation. The controller is configured to implement a third program operation of supplying, to the second metal-containing layer, a third program current from the third portion toward the fourth portion, and a fourth program operation of supplying, to the second metal-containing layer, a fourth program current from the fourth portion toward the third portion. A third electrical resistance between the third magnetic layer and one of the third portion or the fourth portion after the third program operation is different from a fourth electrical resistance between the third magnetic layer and the one of the third portion or the fourth portion after the second program operation.

According to another embodiment, a method for manufacturing a magnetic memory device is disclosed. The method can include forming a stacked film on a metal-containing film provided on a base member. The stacked film includes a first magnetic film, a second magnetic film provided between the first magnetic film and the metal-containing film, and an intermediate film provided between the first magnetic film and the second magnetic film. The intermediate film is nonmagnetic. The method can include forming a plurality of first trenches reaching the metal-containing film. The plurality of first trenches extend along a third direction and are arranged in a second direction. The second direction crosses a first direction. The first direction is perpendicular to a surface of the metal-containing film. The third direction crosses a plane including the first direction and the second direction. The method can include forming a first insulating portion inside the first trenches. The method can include forming a plurality of second trenches extending in the second direction by removing a portion of the stacked film and a portion of the first insulating portion after the forming of the first insulating portion. One of the plurality of second trenches include a first trench region and a second trench region. The first trench region overlaps the stacked film in the third direction. The second trench region overlaps the first insulating portion in the third direction. A width along the third direction of the first trench region is narrower than a width along the third direction of the second trench region. In addition, the method can include removing the metal-containing film exposed in the plurality of second trenches, and forming a second insulating portion inside the plurality of second trenches.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment.

Figure 1B:
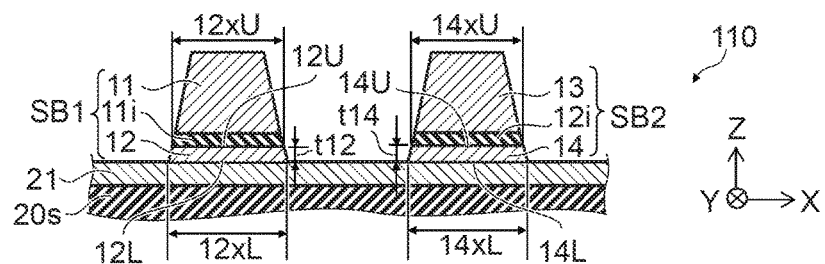
Figure 1C:
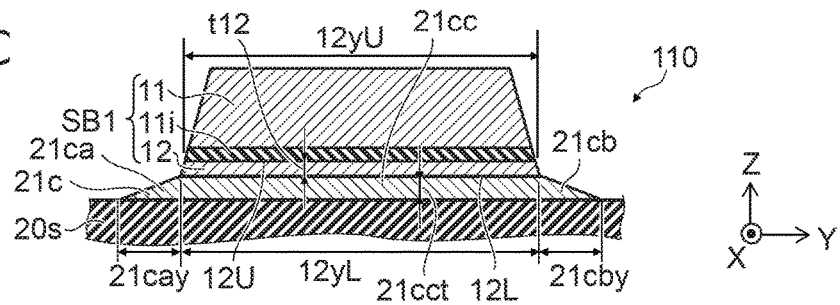
Figure 1D:
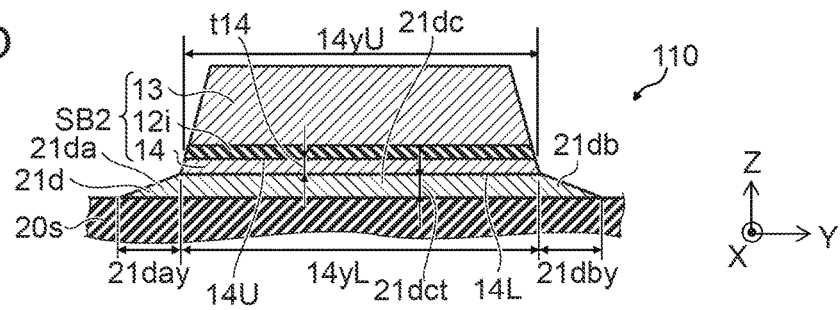

FIG. 1A is a perspective view. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A.

As shown in FIG. 1A to FIG. 1D, the magnetic memory device 110 according to the embodiment includes a metal-containing layer 21, a first magnetic layer 11, a second magnetic layer 12, a first intermediate layer 11$i$, and a controller 70. In the example, a base member 20$s$, a third magnetic layer 13, a fourth magnetic layer 14, and a second intermediate layer 12$i$ are further provided.

The first magnetic layer 11, the second magnetic layer 12, and the first intermediate layer 11$i$ are included in a first stacked body SB1. The third magnetic layer 13, the fourth magnetic layer 14, and the second intermediate layer 12$i$ are included in a second stacked body SB2. Each of these stacked bodies corresponds to one memory portion (memory cell). Thus, multiple stacked bodies are provided in the magnetic memory device 110. The number of stacked bodies is arbitrary.

The metal-containing layer 21 is provided on the base member 20$s$. The stacked bodies recited above are provided on the metal-containing layer 21. The base member 20$s$ may be at least a portion of a substrate. The base member 20$s$ is, for example, insulative. The base member 20$s$ may include, for example, a substrate including at least one of silicon oxide, aluminum oxide, or the like. The silicon oxide is, for example, thermally-oxidized silicon.

The metal-containing layer 21 includes, for example, tantalum (Ta), etc. Examples of the material of the metal-containing layer 21 are described below.

The metal-containing layer 21 includes first to fifth portions 21$a$ to 21$e$. The third portion 21$c$ is positioned between the first portion 21$a$ and the second portion 21$b$. The fourth portion 21$d$ is positioned between the third portion 21$c$ and the second portion 21$b$. The fifth portion 21$e$ is positioned between the third portion 21$c$ and the fourth portion 21$d$.

The first stacked body SB1 is provided on the third portion 21$c$. The second stacked body SB2 is provided on the fourth portion 21$d$. A stacked body is not provided on the fifth portion 21$e$. Insulating portions that are described below are provided on the fifth portion 21$e$.

The first magnetic layer 11 is separated from the third portion 21$c$ along a first direction.

The first direction is taken as a Z-axis direction. One axis perpendicular to the Z-axis direction is taken as an X-axis direction. A direction perpendicular to the Z-axis direction and the X-axis direction is taken as a Y-axis direction.

In the metal-containing layer 21, the direction from the first portion 21$a$ toward the second portion 21$b$ is taken as a second direction. The second direction is, for example, the X-axis direction. The first direction crosses the second direction. The metal-containing layer 21 extends along the X-axis direction.

The second magnetic layer 12 is provided between the first magnetic layer 11 and a portion of the third portion 21$c$.

The first intermediate layer 11$i$ includes a portion provided between the first magnetic layer 11 and the second magnetic layer 12. The first intermediate layer 11$i$ is nonmagnetic.

In the second stacked body SB2, the third magnetic layer 13 is separated from the fourth portion 21$d$ in the first direction (the Z-axis direction). The fourth magnetic layer 14 is provided between the third magnetic layer 13 and a portion of the fourth portion 21$d$. The second intermediate layer 12$i$ includes a portion provided between the third magnetic layer 13 and the fourth magnetic layer 14. The second intermediate layer 12$i$ is nonmagnetic.

The first magnetic layer 11 and the third magnetic layer are, for example, fixed magnetic layers. The second magnetic layer 12 and the fourth magnetic layer 14 are, for example, free magnetic layers. A first magnetization 11M of the first magnetic layer 11 does not change easily compared to a second magnetization 12M of the second magnetic layer 12. A third magnetization 13M of the third magnetic layer 13 does not change easily compared to a fourth magnetization 14M of the fourth magnetic layer 14. For example, the first intermediate layer 11$i$ and the second intermediate layer 12$i$ function as tunneling layers.

For example, the stacked bodies (the first stacked body SB1, the second stacked body SB2, etc.) function as magnetic variable resistance elements. For example, a TMR (Tunnel Magneto Resistance Effect) occurs in the stacked bodies. For example, the electrical resistance of the path including the first magnetic layer 11, the first intermediate layer 11$i$, and the second magnetic layer 12 changes according to the difference between the orientation of the first magnetization 11M and the orientation of the second magnetization 12M. For example, the electrical resistance of the path including the third magnetic layer 13, the second intermediate layer 12$i$, and the fourth magnetic layer 14 changes according to the difference between the orientation of the third magnetization 13M and the orientation of the fourth magnetization 14M. For example, the stacked body has a magnetic tunnel junction (MTJ).

In the example, the first magnetization 11M and the third magnetization 13M are aligned with the Y-axis direction. The second magnetization 12M and the fourth magnetization 14M are aligned with the Y-axis direction. For example, the first magnetic layer 11 and the third magnetic layer 13 function as reference layers. For example, the second magnetic layer 12 and the fourth magnetic layer 14 function as memory layers.

For example, the second magnetic layer 12 and the fourth magnetic layer 14 function as layers that store information. For example, a first state in which the second magnetization 12M is oriented in one direction corresponds to first information that is stored. A second state in which the second magnetization 12M is oriented in another direction corresponds to second information that is stored. The first information corresponds to, for example, one of "0" or "1." The second information corresponds to the other of "0" or "1." Similarly, the orientation of the fourth magnetization 14M corresponds to such information.

For example, the second magnetization 12M and the fourth magnetization 14M can be controlled by a current (a program current) flowing in the metal-containing layer 21. For example, the orientations of the second magnetization 12M and the fourth magnetization 14M can be controlled by the orientation of the current (the program current) of the metal-containing layer 21. For example, the metal-containing layer 21 functions as, for example, a spin orbit layer (SOL). For example, the orientation of the second magnetization 12M can be changed by the spin-orbit torque generated between the metal-containing layer 21 and the second magnetic layer 12. For example, the orientation of the fourth magnetization 14M can be changed by the spin-orbit torque generated between the metal-containing layer 21 and the fourth magnetic layer 14. The spin-orbit torque is based on the current (the program current) flowing in the metal-containing layer 21.

The current (the program current) is supplied by the controller 70. For example, the controller includes a drive circuit 75.

The controller 70 is electrically connected with the first portion 21a, the second portion 21b, and the first magnetic layer 11. In the example, the controller 70 is further electrically connected with the third magnetic layer 13. In the example, a first switch element Sw1 (e.g., a transistor) is provided in the current path between the drive circuit 75 and the first magnetic layer 11. A second switch element Sw2 (e.g., a transistor) is provided in the current path between the drive circuit 75 and the third magnetic layer 13. These switch elements are included in the controller 70.

In a first program operation, the controller 70 supplies a first program current Iw1 to the metal-containing layer 21. Thereby, the first state is formed. The first program current Iw1 is a current from the first portion 21a toward the second portion 21b. In a second program operation, the controller 70 supplies a second program current Iw2 to the metal-containing layer 21. Thereby, the second state is formed. The second program current Iw2 is a current from the second portion 21b toward the first portion 21a.

A first electrical resistance between the first magnetic layer 11 and the first portion 21a after the first program operation (the first state) is different from a second electrical resistance between the first magnetic layer 11 and the first portion 21a after the second program operation (the second state).

For example, the difference between these electrical resistances is based on the difference between the states of the second magnetization 12M between the first state and the second state.

Similarly, the controller 70 implements a third program operation of supplying the first program current Iw1 to the metal-containing layer 21. Thereby, a third state is formed. The controller 70 implements a fourth program operation of supplying the second program current Iw2 to the metal-containing layer 21. Thereby, a fourth state is formed. A third electrical resistance between the third magnetic layer 13 and the first portion 21a after the third program operation (the third state) is different from a fourth electrical resistance between the third magnetic layer 13 and the first portion 21a after the fourth program operation (the fourth state).

For example, the difference between these electrical resistances is based on the difference between the states of the fourth magnetization 14M between the third state and the fourth state.

In a read operation, the controller 70 may sense a characteristic (which may be a voltage, a current, or the like) corresponding to the electrical resistance between the first magnetic layer 11 and the first portion 21a. In the read operation, the controller 70 may sense a characteristic (which may be a voltage, a current, or the like) corresponding to the electrical resistance between the third magnetic layer 13 and the first portion 21a.

One of the first stacked body SB1 (a first memory cell) or the second stacked body SB2 (a second memory cell) is selected by operations of the first switch element Sw1 and the second switch element Sw2 recited above. The program operation and the read operation of the desired memory cell is performed.

As described above, the controller 70 is electrically connected with the first stacked body SB1 (the first magnetic layer 11) and the second stacked body SB2 (the third magnetic layer 13). When programming information to the first stacked body SB1, a prescribed select voltage is applied to the first magnetic layer 11. At this time, an unselect voltage is applied to the second stacked body SB2. On the other hand, when programming information to the second stacked body SB2, the prescribed select voltage is applied to the third magnetic layer 13. At this time, the unselect voltage is applied to the first stacked body SB1. The application of a voltage of 0 volts also is included in the "application of a voltage." The potential of the select voltage is different from the potential of the unselect voltage.

For example, in the first program operation, the controller 70 sets the first magnetic layer 11 to a potential (e.g., the select potential) that is different from the potential (e.g., the unselect potential) of the third magnetic layer 13. In the second program operation, the controller 70 sets the first magnetic layer 11 to a potential (e.g., the select potential) that is different from the potential (e.g., the unselect potential) of the third magnetic layer 13.

For example, in the third program operation, the controller 70 sets the third magnetic layer 13 to a potential (e.g., the select potential) that is different from the potential (e.g., the unselect potential) of the first magnetic layer 11. In the fourth program operation, the controller 70 sets the third magnetic layer 13 to a potential (e.g., the select potential) that is different from the potential (e.g., the unselect potential) of the first magnetic layer 11.

For example, such a selection of the potentials is performed by the operations of the first switch element Sw1 and the second switch element Sw2.

The multiple stacked bodies correspond respectively to multiple memory cells. It is possible to store mutually-different information in the multiple memory cells. When storing the information in the multiple memory cells, for example, after storing one of "1" or "0" in the multiple memory cells, the other of "1" or "0" may be stored in several memory cells of the multiple memory cells as desired. For example, after one of "1" or "0" is stored in one of the multiple memory cells, one of "1" or "0" may be stored in one other of the multiple memory cells.

In the description recited above, the first portion 21a and the second portion 21b are interchangeable with each other. For example, the electrical resistance recited above may be the electrical resistance between the first magnetic layer 11 and the second portion 21b. The electrical resistance recited above may be the electrical resistance between the third magnetic layer 13 and the second portion 21b.

In the embodiment, a portion of the metal-containing layer 21 protrudes in the Y-axis direction using the position of the stacked body as a reference. The thickness of the protruding portion is locally thin. This configuration is described below.

As shown in FIG. 1C, the third portion 21c includes a first overlap region 21cc, a first non-overlap region 21ca, and a second non-overlap region 21cb. The first overlap region 21cc overlaps the second magnetic layer 12 in the first direction (the Z-axis direction). The first non-overlap region 21ca does not overlap the second magnetic layer 12 in the first direction. The second non-overlap region 21cb does not overlap the second magnetic layer 12 in the first direction. The direction from the first non-overlap region 21ca toward the second non-overlap region 21cb is aligned with a third direction. The third direction crosses the first direction and the second direction. For example, the third direction crosses a plane including the first direction and the second direction. The third direction is, for example, the Y-axis direction. The first overlap region 21cc is positioned between the first non-overlap region 21ca and the second non-overlap region 21cb in the third direction.

The thickness along the first direction (the Z-axis direction) of at least a portion of the first non-overlap region 21ca is thinner than a first overlap region thickness 21cct along the first direction of the first overlap region 21cc. The thickness along the first direction of at least a portion of the second non-overlap region 21cb is thinner than the first overlap region thickness 21cct.

Thus, in the embodiment, protruding portions (the first non-overlap region 21ca and the second non-overlap region 21cb) are provided; and the thicknesses of the protruding portions are thinner than the thickness (the first overlap region thickness 21cct) of the other portion (the first overlap region 21cc). Thereby, the program current can be reduced.

An example of characteristics of the magnetic memory device will now be described.

Figure 2A:
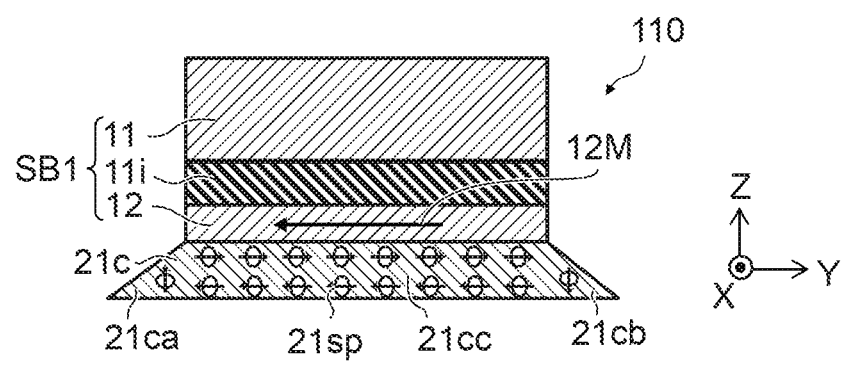
FIG. 2A and FIG. 2B are schematic cross-sectional views illustrating operations of the magnetic memory device.
Figure 2B:
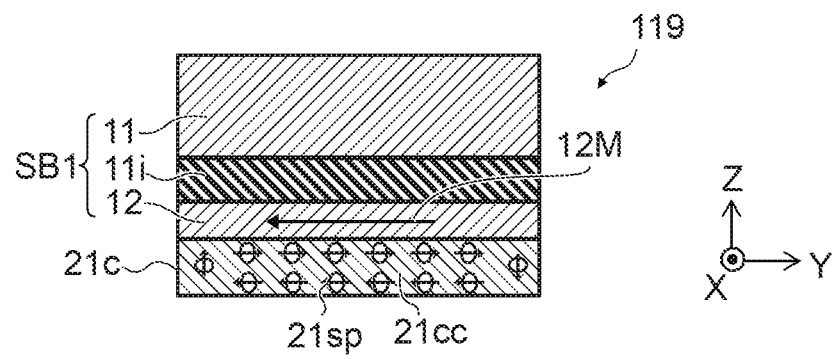

FIG. 2A and FIG. 2B are schematic cross-sectional views illustrating operations of the magnetic memory device.

FIG. 2A corresponds to the magnetic memory device 110 according to the embodiment. FIG. 2B corresponds to a magnetic memory device 119 according to a first reference example. In the third portion 21c of the metal-containing layer 21 in the first reference example, the first overlap region 21cc is provided; but the protruding portions (the first non-overlap region 21ca and the second non-overlap region 21cb) are not provided.

As shown in FIG. 2B, the paths of the electrons are bent according to the direction of a spin 21sp in the metal-containing layer 21 when a current flows in the metal-containing layer 21. It is considered that the spin 21sp that is polarized in an orientation antiparallel to the second magnetization 12M of the second magnetic layer 12 accumulates in the upper portion of the metal-containing layer 21. On the other hand, it is considered that the spin 21sp that is polarized in an orientation in a direction parallel to the second magnetization 12M accumulates in the lower portion of the metal-containing layer 21. It is considered that the spin 21sp that is polarized in the upward direction or the downward direction accumulates in the end portion in the Y-axis direction of the metal-containing layer 21.

In the magnetic memory device 119 of the first reference example, a non-overlap region such as those recited above is not provided in the metal-containing layer 21. In the first reference example, the spin torque is transferred toward the stacked body (the MTJ element) from the metal-containing layer 21 via a region (the end portion in the Y-axis direction) where the polarized spin is polarized in the vertical direction (the Z-axis direction). Therefore, the coherency of the magnetization reversal degrades easily.

Conversely, in the magnetic memory device 110 according to the embodiment as shown in FIG. 2A, the first non-overlap region 21ca and the second non-overlap region 21cb are provided in the metal-containing layer 21 in addition to the first overlap region 21cc. Also, the thicknesses of these non-overlap regions are thinner than the thickness of the first overlap region 21cc. In such a case, the coherency of the spin polarization is maintained easily. The transfer efficiency of the spin torque can be high.

Thereby, the efficiency of the programming increases. Thereby, the program current can be reduced.

On the other hand, a second reference example may be considered in which the first non-overlap region 21ca and the second non-overlap region 21cb are provided; and the thicknesses of these non-overlap regions are the same as the thickness of the first overlap region 21cc. In the second reference example, the first non-overlap region 21ca and the second non-overlap region 21cb do not contribute to the spin torque transfer. As a result, the program current increases.

Conversely, in the magnetic memory device 110 according to the embodiment, the thicknesses of the non-overlap regions are thinner than the thickness of the first overlap region 21cc. Thereby, for example, a shunt current that flows in the first non-overlap region 21ca and the second non-overlap region 21cb and is ineffective for the recording function can be reduced while segregating the polarized electrons that reduce the coherency of the spin polarization to the edge of the metal-containing layer 21. Thereby, for example, the program current can be reduced. The coherency of the spin polarization is maintained easily. Because the transfer efficiency of the spin torque can be high, the efficiency of the programming can be increased; and the program current can be reduced.

Because the program current can be reduced, for example, the capacity of the driver driving the memory unit can be reduced. Thereby, for example, the bit density can be increased because the size of the driver can be small. The decrease of the program current makes higher energy conservation possible.

For example, the width (the protrusion amount) in the Y-axis direction of the non-overlap region of the metal-containing layer 21 recited above is larger than the protrusion amount due to the patterning error, etc.

As shown in FIG. 1C, for example, the metal-containing layer 21 has a length 21cay along the third direction (the Y-axis direction) of the first non-overlap region 21ca, and a length 21cby along the third direction of the second non-overlap region 21cb. Here, a first ratio is the ratio of the total of the length 21cay and the length 21cby to the first overlap region thickness 21cct. The first ratio is the ratio of the protrusion amount of the metal-containing layer 21 to the thickness of the metal-containing layer 21. The protrusion amount is large if the first ratio is high.

On the other hand, as shown in FIG. 1B, there are cases where the second magnetic layer 12 has a tapered configuration. For example, the second magnetic layer 12 has a thickness t12 along the first direction (the Z-axis direction). The second magnetic layer 12 has a surface 12L (the lower surface) opposing the metal-containing layer 21, and a surface 12U (the upper surface) opposing the first intermediate layer 11i. A length 12xL is the length along the second direction (the X-axis direction) of the surface 12L. A length $12xU$ is the length along the second direction (the X-axis direction) of the surface 12U.

In such a case, the first ratio is higher than the ratio of the absolute value of the difference between the length $12xL$ and the length $12xU$ to the thickness t12. In other words, the first ratio is higher than the ratio recited above caused by the taper provided in the second magnetic layer 12.

Thus, by providing the large protruding portions (the first non-overlap region 21ca and the second non-overlap region 21cb), the coherency of the spin polarization is maintained; and the transfer efficiency of the spin torque can be high. The efficiency of the programming can be increased; and the program current can be reduced. Thereby, the bit density can be increased.

If the protrusion amount of the protruding portion is excessively large, the width in the Y-axis direction of the metal-containing layer 21 becomes large. In the case where the multiple metal-containing layers 21 are provided, the pitch of the multiple metal-containing layers 21 becomes large; and the increase of the bit density is insufficient.

In the embodiment, for example, it is favorable for the length $21cay$ along the third direction (the Y-axis direction) of the first non-overlap region 21ca and the length $21cby$ along the third direction of the second non-overlap region 21cb each to be less than 0.25 times the width (a length $21yL$ described below) along the third direction of the second magnetic layer 12. Thereby, a high bit density can be maintained.

In the embodiment, the protrusion amount (e.g., the length $21cay$ or the length $21cby$) of the protruding portion provided in the metal-containing layer 21 is, for example, not less than 0.5 times and not more than 10 times the spin diffusion length of the metal-containing layer 21.

As shown in FIG. 1C, a length $12yL$ is the length along the third direction (the Y-axis direction) of the surface 12L of the second magnetic layer 12 opposing the metal-containing layer 21. A length $12yU$ is the length along the third direction (the Y-axis direction) of the surface 12U of the second magnetic layer 12 opposing the first intermediate layer 11i. In the embodiment, the first ratio recited above is higher than the ratio of the absolute value of the difference between the length $12yL$ and the length $12yU$ to the thickness t12 along the first direction of the second magnetic layer 12.

As recited below, the second stacked body SB2 also has a configuration similar to that of the first stacked body SB1.

As shown in FIG. 1D, the fourth portion 21d includes a second overlap region 21dc, a third non-overlap region 21da, and a fourth non-overlap region 21db. The second overlap region 21dc overlaps the fourth magnetic layer 14 in the first direction (the Z-axis direction). The third non-overlap region 21da does not overlap the fourth magnetic layer 14 in the first direction. The fourth non-overlap region 21db does not overlap the fourth magnetic layer 14 in the first direction. The direction from the third non-overlap region 21da toward the fourth non-overlap region 21db is aligned with the third direction (the Y-axis direction). The second overlap region 21dc is positioned between the third non-overlap region 21da and the fourth non-overlap region 21db in the third direction.

The thickness along the first direction (the Z-axis direction) of at least a portion of the third non-overlap region 21da is thinner than a second overlap region thickness 21dct along the first direction of the second overlap region 21dc. The thickness along the first direction of at least a portion of the fourth non-overlap region 21db is thinner than the second overlap region thickness 21dct.

As shown in FIG. 1D, the metal-containing layer 21 has a length 21day along the third direction (the Y-axis direction) of the third non-overlap region 21da, and a length $21dby$ along the third direction of the fourth non-overlap region 21db. In such a case, a second ratio is the ratio of the total of the length 21day and the length $21dby$ to the second overlap region thickness 21dct.

On the other hand, as shown in FIG. 1B, the fourth magnetic layer 14 has a thickness t14 along the first direction (the Z-axis direction). The fourth magnetic layer 14 has a surface 14L (the lower surface) opposing the metal-containing layer 21, and a surface 14U (the upper surface) opposing the second intermediate layer 12i. A length $14xL$ is the length along the second direction (the X-axis direction) of the surface 14L. A length $14xU$ is the length along the second direction (the X-axis direction) of the surface 14U.

In such a case, the second ratio is higher than the ratio of the absolute value of the difference between the length $14xL$ and the length $14xU$ to the thickness t14. In other words, the second ratio is higher than the ratio caused by the taper provided in the fourth magnetic layer 14.

As shown in FIG. 1D, a length $14yL$ is the length along the third direction (the Y-axis direction) of the surface 14L of the fourth magnetic layer 14 opposing the metal-containing layer 21. A length $14yU$ is the length along the third direction (the Y-axis direction) of the surface 14U of the fourth magnetic layer 14 opposing the second intermediate layer 12i. In the embodiment, the second ratio recited above is higher than the ratio of the absolute value of the difference between the length $14yL$ and the length $14yU$ to the thickness t14 along the first direction of the fourth magnetic layer 14.

For example, information relating to the lengths, the thicknesses, the widths, etc., recited above are obtained using a transmission electron microscope, etc.

Figure 3A:
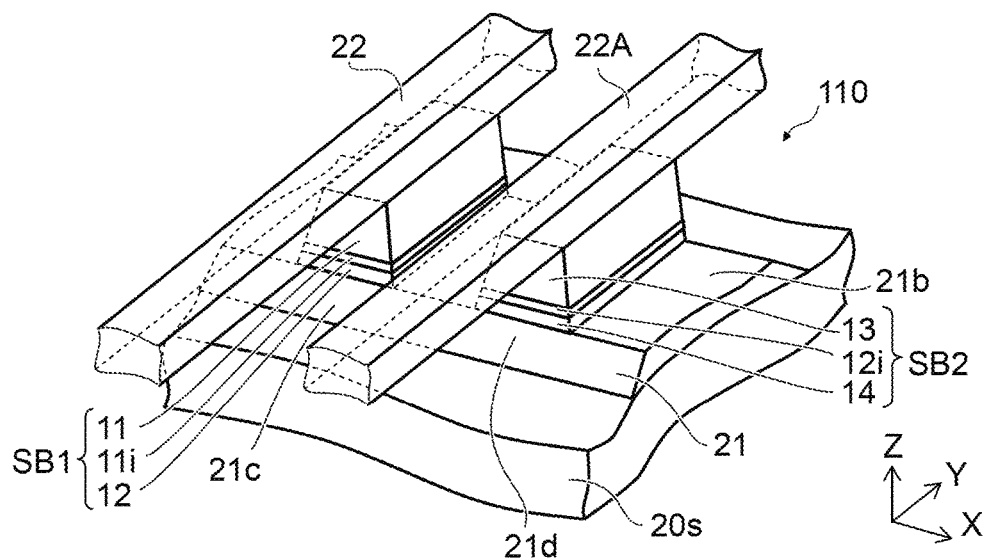
FIG. 3A and FIG. 3B are schematic views illustrating the magnetic memory device according to the first embodiment.
Figure 3B:
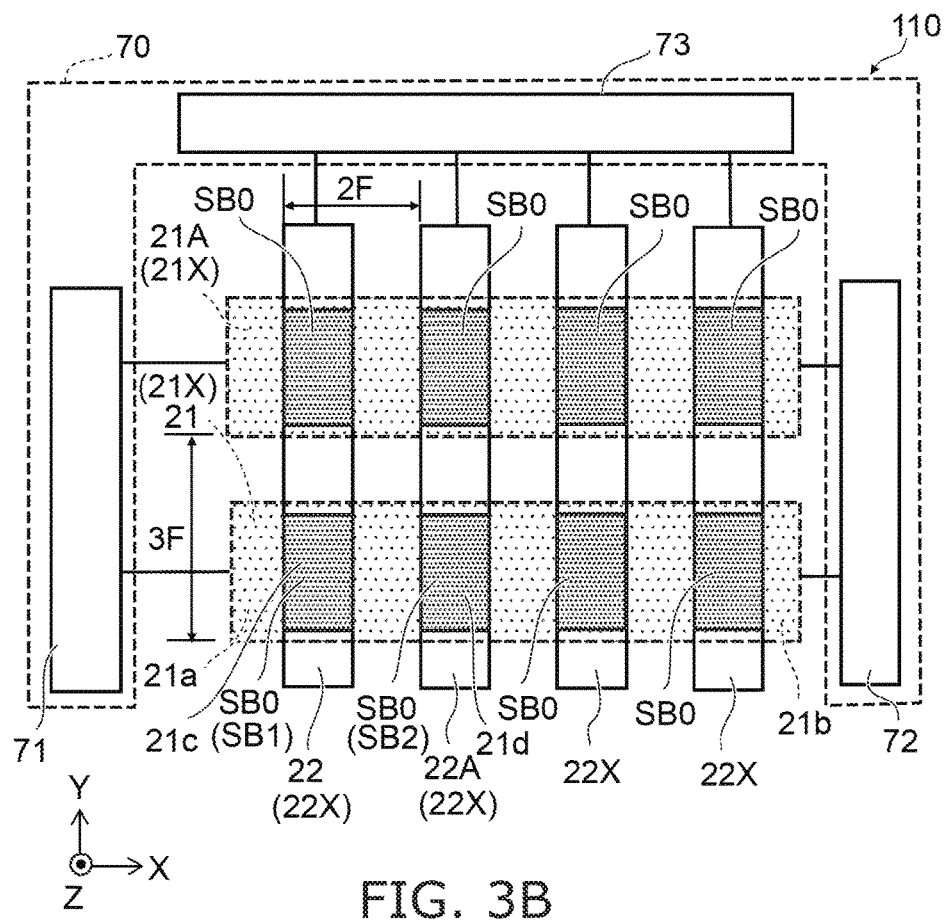

FIG. 3A and FIG. 3B are schematic views illustrating the magnetic memory device according to the first embodiment.

FIG. 3A is a perspective view. FIG. 3B is a plan view.

As shown in FIG. 3B, for example, multiple electrodes 22X and multiple metal-containing layers 21X are provided in the magnetic memory device 110. For example, the multiple electrodes 22X extend in the Y-axis direction. The multiple electrodes 22X are arranged in the X-axis direction. One of the multiple electrodes 22X is an electrode 22. One other of the multiple electrodes 22X is an electrode 22A. For example, the multiple metal-containing layers 21X extend in the X-axis direction. The multiple metal-containing layers 21X are arranged in the Y-axis direction. One of the multiple metal-containing layers 21X is a metal-containing layer 21. One other of the multiple metal-containing layers 21X is a metal-containing layer 21A.

For example, stacked bodies SB0 are provided between the multiple electrodes 22X and the multiple metal-containing layers 21X.

As shown in FIG. 3A, for example, the first stacked body SB1 is provided between the metal-containing layer 21 and the electrode 22. The second stacked body SB2 is provided between the metal-containing layer 21 and the electrode 22A.

As shown in FIG. 3B, for example, the pitch of the multiple electrodes 22X is "2F." The pitch of the multiple metal-containing layers 21X is, for example, "3F." For example, "F" is the minimum patterning dimension.

As shown in FIG. 3B, the controller 70 includes first to third circuits 71 to 73. The first circuit 71 is electrically connected with the first portion 21a of the metal-containing layer 21. The second circuit 72 is electrically connected with the second portion 21b of the metal-containing layer 21. The third circuit 73 is electrically connected with the stacked body SB1 (the first magnetic layer 11) via the electrode 22. The first circuit 71 is electrically connected with an end of each of the multiple metal-containing layers 21X. The second circuit 72 is electrically connected with another end of each of the multiple metal-containing layers 21X. The third circuit 73 is electrically connected with each of the multiple electrodes 22X. In FIG. 3B, the switch elements (referring to FIG. 1A) are not illustrated.

Figure 4A:
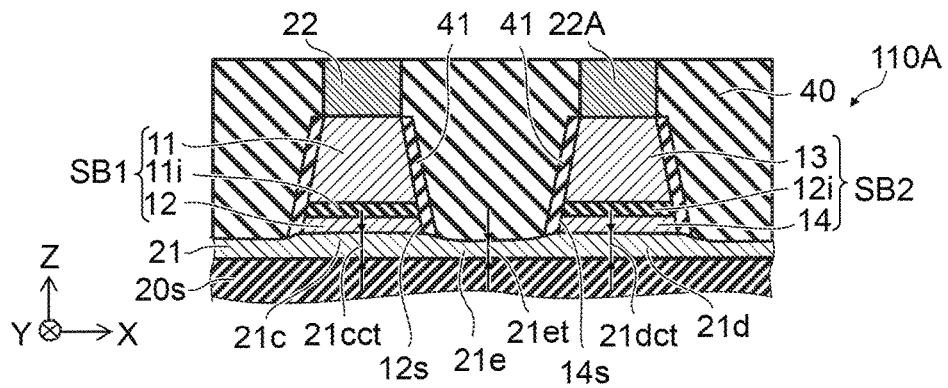
FIG. 4A to FIG. 4C are schematic cross-sectional views illustrating other magnetic memory devices according to the first embodiment.
Figure 4B:
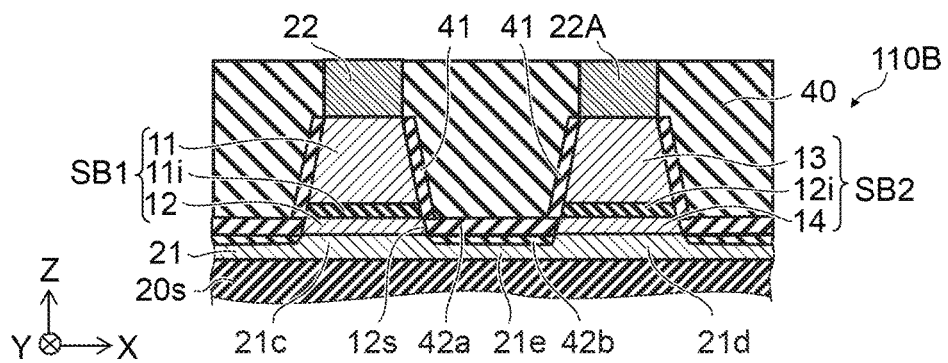
Figure 4C:
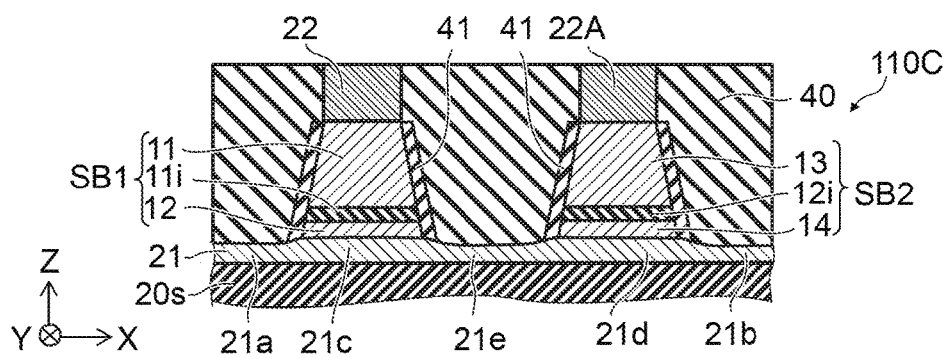

FIG. 4A to FIG. 4C are schematic cross-sectional views illustrating other magnetic memory devices according to the first embodiment.

As shown in FIG. 4A, the metal-containing layer 21, the first stacked body SB1, and the second stacked body SB2 are provided in another magnetic memory device 110A according to the embodiment as well. In the example, the thickness of the metal-containing layer 21 is locally thin in a region between the two stacked bodies. An insulating portion 40 is provided around the multiple stacked bodies. Otherwise, the magnetic memory device 110A is similar to the magnetic memory device 110.

In the magnetic memory device 110A, a thickness 21et along the first direction (the Z-axis direction) of the fifth portion 21e of the metal-containing layer 21 is thinner than the first overlap region thickness 21cct. The thickness 21et is thinner than the second overlap region thickness 21dct. By providing such a difference between the thicknesses, for example, the spin coherence improves. For example, the spin coherence particularly improves more in the case of a structure in which the width (the length along the Y-axis direction) of the metal-containing layer 21 is wider than the width (the length along the Y-axis direction) of the stacked bodies SB0.

For example, because the thickness 21et of the fifth portion 21e of the metal-containing layer 21 is thin, the consumed energy per unit distance traveled becomes high when the electrons pass through the fifth portion 21e. The travel direction of the electrons is aligned with the X-axis direction; and, for example, the dispersion (the fluctuation) of the direction of the flow of the electrons flowing into the third portion 21c or the fourth portion 21d from the fifth portion 21e becomes small. As a result, the dispersion (the fluctuation) of the direction of the electrons flowing into the stacked bodies SB0 is suppressed. The spin coherence improves.

For example, after forming the stacked bodies recited above on the metal-containing film used to form the metal-containing layers 21, the surface of the metal-containing film not covered with the stacked bodies is processed (e.g., plasma processing). The processing is, for example, oxidation treatment or nitridation treatment. Thereby, the processed surface portion of the metal-containing film is oxidized or nitrided. The remaining portions become the metal-containing layers 21. For example, the difference between the thicknesses recited above can be formed by such processing.

The insulating portion 40 includes, for example, at least a portion selected from the group consisting of silicon oxide, silicon nitride, and silicon oxynitride. The insulating portion 40 may include a portion of a compound formed by the oxidizing or the nitriding recited above.

A compound layer 41 is provided in the example. The compound layer 41 includes a compound including a metal included in the second magnetic layer 12 (or the fourth magnetic layer 14). The compound layer 41 may further include a compound including a metal included in the first magnetic layer 11 (or the third magnetic layer 13). The second magnetic layer 12 has a side surface 12s. For example, the side surface 12s crosses the second direction (the X-axis direction). The compound layer 41 opposes the side surface 12s. The fourth magnetic layer 14 has a side surface 14s. For example, the side surface 14s crosses the second direction (the X-axis direction). The compound layer 41 opposes the side surface 14s. For example, leakage current at the side surfaces of the stacked bodies can be suppressed by the compound layer 41.

As shown in FIG. 4B, a first compound region 42a (a compound layer) is provided in another magnetic memory device 110B according to the embodiment. The first compound region 42a includes a compound including a metal included in the second magnetic layer 12 (or the fourth magnetic layer 14). The first compound region 42a opposes the side surface 12s of the second magnetic layer 12 and the side surface 14s of the fourth magnetic layer 14. The first compound region 42a is aligned with the direction (the X-axis direction) connecting the second magnetic layer 12 and the fourth magnetic layer 14 between the second magnetic layer 12 and the fourth magnetic layer 14. For example, the first compound region 42a is provided to be continuous between the second magnetic layer 12 and the fourth magnetic layer 14. For example, the first compound region 42a is formed by processing a portion of the magnetic film used to form the second magnetic layer 12 and the fourth magnetic layer 14. The portions that are not processed are used to form the second magnetic layer 12 and the fourth magnetic layer 14. The processing is oxidizing or nitriding. The processed portion (the first compound region 42a) functions as an insulating film. The processing may include amorphizing.

The first compound region 42a is provided between the insulating portion 40 and the fifth portion 21e. A second compound region 42b may be provided between the first compound region 42a and the fifth portion 21e. For example, the second compound region 42b may be formed by changing a portion of the metal-containing film used to form the metal-containing layer 21. The second compound region 42b includes, for example, an oxide, nitride, or oxynitride of a metal included in the metal-containing layer 21.

The second compound region 42b may be formed by the processing of the first compound region 42a recited above. The boundary between the first compound region 42a and the second compound region 42b may be distinct or indistinct. The metal that is included in the second compound region 42b may be diffused into the first compound region 42a. The metal that is included in the first compound region 42a may be diffused into the second compound region 42b.

The first compound region 42a may be discontinuous between the second magnetic layer 12 and the fourth magnetic layer 14. The first compound region 42a may further include a metal included in the first magnetic layer 11 (or third magnetic layer 13).

In another magnetic memory device 110C according to the embodiment as shown in FIG. 4C, the crystal structure of the third portion 21c of the metal-containing layer 21 is different from the crystal structure of the other portions (e.g., the first portion 21a, the second portion 21b, the fifth portion 21e, etc.) of the metal-containing layer 21. For example, surface treatment or the like of a portion of the metal-containing film used to form the metal-containing layer 21 is performed. On the other hand, the processing is not performed on the portions (the third portion 21c, the fourth portion 21d, etc.) positioned under the stacked bodies. The processing is, for example, the irradiation of a gas cluster ion beam. For example, an Ar cluster is irradiated. By such processing, the crystal structure of at least a portion of the processed portion is changed.

For example, the crystal structure of the third portion 21c of the metal-containing layer 21 is the β-phase. The crystal structure of at least a portion (e.g., the surface portion) of the other portions (e.g., the first portion 21a, the second portion 21b, the fifth portion 21e, etc.) of the metal-containing layer 21 is the α-phase. For example, information relating to these crystal structures is obtained by observation using a transmission electron microscope, etc.

For example, per unit volume (unit surface area), the proportion of the β-phase region of the third portion 21c to the entire third portion 21c is higher than, for example, the proportion of the β-phase region of the other regions (e.g., the first portion 21a, the second portion 21b, the fifth portion 21e, etc.) to the entire other regions.

For example, at least a portion of the third portion 21c includes β-phase Ta. For example, at least a portion of the first portion 21a (or the fifth portion 21e) includes α-phase Ta. The absolute value of the spin Hall angle is large for β-phase Ta. On the other hand, the conductivity of α-phase Ta is higher than the conductivity of β-phase Ta.

By setting the crystal structures to be different as recited above, for example, resistance reduction due to a higher conductivity can be realized; therefore, the program power can be reduced. The resistance of the metal-containing layer 21 can be low. Due to the decrease of the program power, for example, the capacity of the driver driving the memory unit can be reduced; and, for example, the size of the driver can be small. The bit density can be increased.

FIG. 5A to FIG. 5H are schematic cross-sectional views illustrating other magnetic memory devices according to the first embodiment.

Figure 5A:
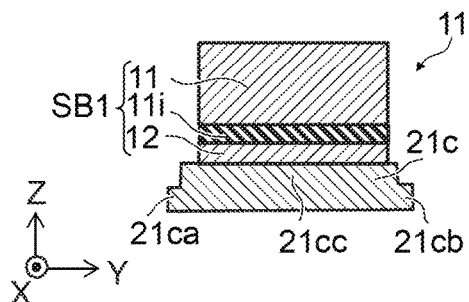
FIG. 5A to FIG. 5H are schematic cross-sectional views illustrating other magnetic memory devices according to the first embodiment.

In a magnetic memory device 110a as shown in FIG. 5A, the thicknesses of the first non-overlap region 21ca and the second non-overlap region 21cb change in step configurations.

Figure 5B:
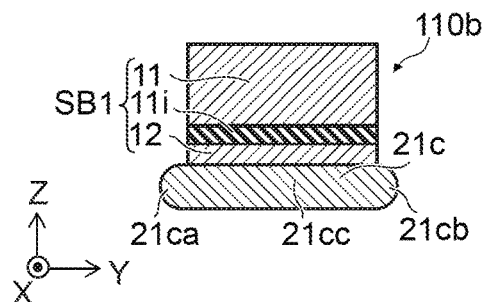

In a magnetic memory device 110b as shown in FIG. 5B, the width in the third direction (the Y-axis direction) of the third portion 21c of the metal-containing layer 21 has a maximum at the central portion in the first direction (the Z-axis direction). The thicknesses of the first non-overlap region 21ca and the second non-overlap region 21cb change continuously.

Figure 5C:
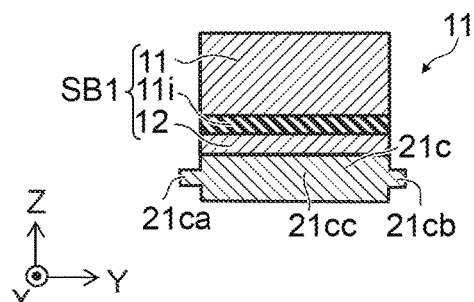
Figure 5D:
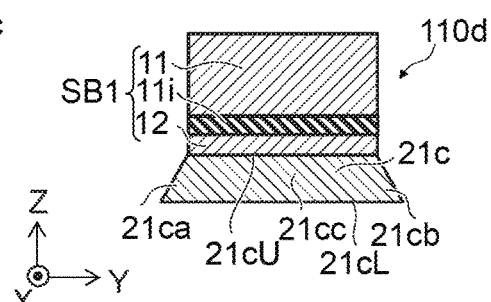

In a magnetic memory device 110c as shown in FIG. 5C, the width in the third direction (the Y-axis direction) of the third portion 21c of the metal-containing layer 21 has a maximum at the central portion in the first direction (the Z-axis direction). The thicknesses of the first non-overlap region 21ca and the second non-overlap region 21cb change in step configurations. In a magnetic memory device 110d as shown in FIG. 5D, the third portion 21c of the metal-containing layer 21 has a surface 21cU opposing the second magnetic layer 12. The width along the third direction (the Y-axis direction) of the surface 21cU is substantially the same as the width along the third direction of the second magnetic layer 12. For example, the width of the surface 21cU recited above is not less than 0.9 times and not more than 1.1 times the width of the second magnetic layer 12 recited above.

Figure 5E:
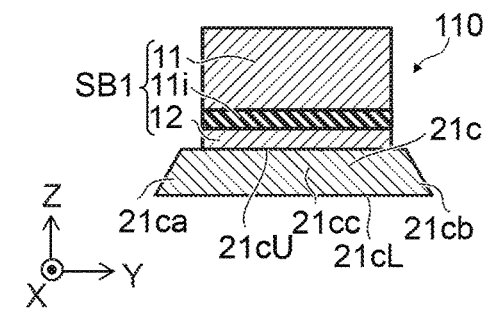

In a magnetic memory device 110e as shown in FIG. 5E, the third portion 21c of the metal-containing layer 21 has the surface 21cU opposing the second magnetic layer 12. The width along the third direction (the Y-axis direction) of the surface 21cU is wider than the width along the third direction of the second magnetic layer 12.

Figure 5F:
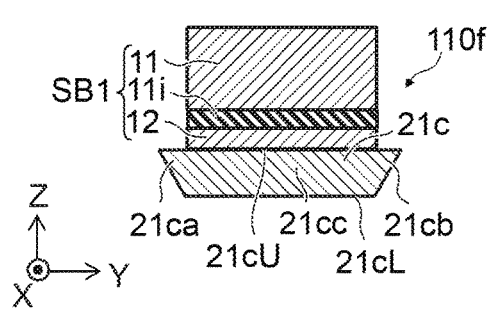

In a magnetic memory device 110f as shown in FIG. 5F, the metal-containing layer 21 has a surface 21cL. The surface 21cL is the opposite surface of the surface 21cU. The width along the third direction (the Y-axis direction) of the surface 21cU is wider than the width along the third direction (the Y-axis direction) of the surface 21cL. In the example, the width along the third direction (the Y-axis direction) of the surface 21cL is substantially the same as the width along the third direction of the second magnetic layer 12. For example, the width of the surface 21cL recited above is not less than 0.9 times and not more than 1.1 times the width of the second magnetic layer 12 recited above.

Figure 5G:
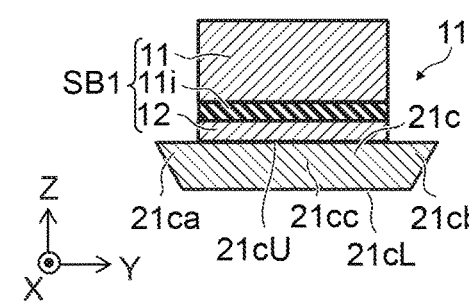

In a magnetic memory device 110g as shown in FIG. 5G as well, the width along the third direction (the Y-axis direction) of the surface 21cU is wider than the width along the third direction (the Y-axis direction) of the surface 21cL. In the example, the width along the third direction (the Y-axis direction) of the surface 21cL is wider than the width along the third direction of the second magnetic layer 12.

Figure 5H:
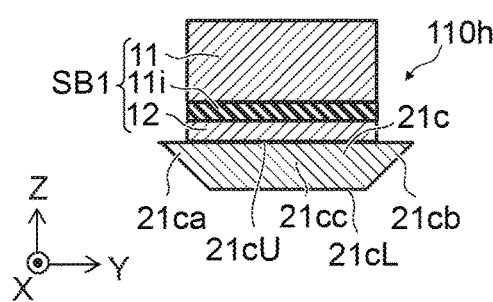

In a magnetic memory device 110h as shown in FIG. 5H as well, the width along the third direction (the Y-axis direction) of the surface 21cU is wider than the width along the third direction (the Y-axis direction) of the surface 21cL. In the example, the width along the third direction (the Y-axis direction) of the surface 21cL is narrower than the width along the third direction of the second magnetic layer 12.

Thus, various modifications of the width of the metal-containing layer 21 are possible in the embodiment.

In the embodiment, the center in the Y-axis direction of the stacked body SB0 and the center in the Y-axis direction of the metal-containing layer 21 may match or may be shifted. In the embodiment, at least one of a difference of the tapered configurations or a difference of the taper angles may be provided in the two Y-axis direction end portions of the metal-containing layer 21.

In the embodiment, the length in the Y-axis direction of the second magnetic layer 12 may be shorter than the length in the Y-axis direction of the metal-containing layer 21. For example, the end portion in the Y-axis direction of the magnetic film used to form the second magnetic layer 12 may be demagnetized by oxidizing, etc. The unoxidized magnetic film is used to form the second magnetic layer 12. The second magnetic layer 12 may be formed of a magnetic region-like configuration due to the oxidizing, etc. The metal-containing layer 21 may be formed of a conductive region-like configuration of the metal-containing film used to form the metal-containing layer 21.

Examples of the metal-containing layer 21, the first magnetic layer 11, the second magnetic layer 12, and the first intermediate layer 11i will now be described. The following description relating to the metal-containing layer 21 is applicable to the other metal-containing layers 21X (the metal-containing layer 21A, etc.). The following description relating to the first magnetic layer 11 is applicable to the third magnetic layer 13. The following description relating to the second magnetic layer 12 is applicable to the fourth magnetic layer 14. The following description relating to the first intermediate layer 11i is applicable to the second intermediate layer 12i.

The metal-containing layer 21 may include, for example, a material having a high spin Hall effect. For example, the metal-containing layer 21 contacts the second magnetic layer 12. For example, the metal-containing layer 21 provides spin-orbit torque to the second magnetic layer 12. For example, the metal-containing layer 21 may function as a spin orbit layer (SOL). For example, the orientation of the second magnetization 12M of the second magnetic layer 12 can be changed by the spin-orbit torque generated between the metal-containing layer 21 and the second magnetic layer 12. For example, the direction of the second magnetization 12M can be controlled according to the orientation of the current (the orientation of the first program current Tw1 or the orientation of the second program current Iw2) flowing through the metal-containing layer 21.

The metal-containing layer 21 includes, for example, at least one selected from the group consisting of tantalum and tungsten. The metal-containing layer 21 includes, for example, at least one selected from the group consisting of β-tantalum and β-tungsten. The spin Hall angle of these materials is negative. The absolute value of the spin Hall angle of these materials is large. Thereby, the second magnetization 12M can be controlled efficiently by the program current.

The metal-containing layer 21 may include at least one selected from the group consisting of platinum and gold. The spin Hall angle of these materials is positive. The absolute value of the spin Hall angle of these materials is large. Thereby, the second magnetization 12M can be controlled efficiently by the program current.

The direction (the orientation) of the spin-orbit torque applied to the second magnetic layer 12 is different due to the polarity of the spin Hall angle. For example, the metal-containing layer 21 applies spin orbit interaction torque to the second magnetic layer 12.

The second magnetic layer 12 is, for example, a free magnetic layer. The second magnetic layer 12 includes, for example, at least one of a ferromagnetic material or a soft magnetic material. The second magnetic layer 12 may include, for example, an artificial lattice.

The second magnetic layer 12 includes, for example, at least one selected from the group consisting of FePd (iron-palladium), FePt (iron-platinum), CoPd (cobalt-palladium), and CoPt (cobalt-platinum). The soft magnetic materials recited above include, for example, CoFeB (cobalt-iron-boron). The artificial lattice recited above includes, for example, a stacked film including a first film and a second film. The first film includes, for example, at least one of NiFe (nickel-iron), Fe (iron), or Co (cobalt). The second film includes, for example, at least one of Cu (copper), Pd (palladium), or Pt (platinum). The first film is, for example, a magnetic material; and the second film is a nonmagnetic material.

The second magnetic layer 12 may include, for example, a ferrimagnetic material.

In the embodiment, for example, the second magnetic layer 12 has in-plane magnetic anisotropy. Thereby, for example, polarized spin that is antiparallel to the magnetization direction can be obtained from the metal-containing layer 21. For example, the second magnetic layer 12 may have at least one of shape magnetic anisotropy in the plane, magneto-crystalline anisotropy in the plane, or induced magnetic anisotropy in the plane due to the stress or the like.

The first intermediate layer 11i includes, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). The first intermediate layer 11i is, for example, a tunneling barrier layer. In the case where the first intermediate layer 11i includes MgO, the thickness of the first intermediate layer 11i is, for example, about 1 nm.

The first magnetic layer 11 is, for example, a reference layer. The first magnetic layer 11 is, for example, a fixed magnetic layer. The first magnetic layer 11 includes, for example, Co (cobalt) and CoFeB (cobalt-iron-boron). The first magnetization 11M of the first magnetic layer 11 is substantially fixed in one direction in the plane (a direction crossing the Z-axis direction). The first magnetic layer 11 is, for example, an in-plane magnetization film.

For example, the thickness of the first magnetic layer 11 (the reference layer) is thicker than the thickness of the second magnetic layer 12 (the free layer). Thereby, the first magnetization 11M of the first magnetic layer 11 is fixed stably in the prescribed direction.

In the embodiment, for example, the base member 20s is aluminum oxide. The metal-containing layer 21 is a Ta layer (having a thickness of, for example, not less than 3 nm and not more than 10 nm). The second magnetic layer 12 includes, for example, a CoFeB layer (having a thickness of, for example, not less than 1.5 nm and not more than 2.5 nm). The first intermediate layer 11i includes a MgO layer (having a thickness of, for example, not less than 0.8 nm and not more than 1.2 nm).

The first magnetic layer 11 includes first to third films. The first film is provided between the third film and the first intermediate layer 11i. The second film is provided between the first film and the third film. The first film includes, for example, a CoFeB film (having a thickness of, for example, not less than 1.5 nm and not more than 2.5 nm). The second film includes, for example, a Ru film (having a thickness of, for example, not less than 0.7 nm and not more than 0.9 nm). The third film includes, for example, a CoFeB film (having a thickness of, for example, not less than 1.5 nm and not more than 2.5 nm).

For example, a ferromagnetic layer may be provided. The first magnetic layer 11 is provided between the ferromagnetic layer and the first intermediate layer 11i. The ferromagnetic layer is, for example, an IrMn-layer (having a thickness not less than 7 nm and not more than 9 nm). The ferromagnetic layer fixes the first magnetization 11M of the first magnetic layer 11. A Ta layer may be provided on the ferromagnetic layer.

Second Embodiment

FIG. 6A to FIG. 6D are schematic views illustrating a magnetic memory device according to a second embodiment.

Figure 6A:
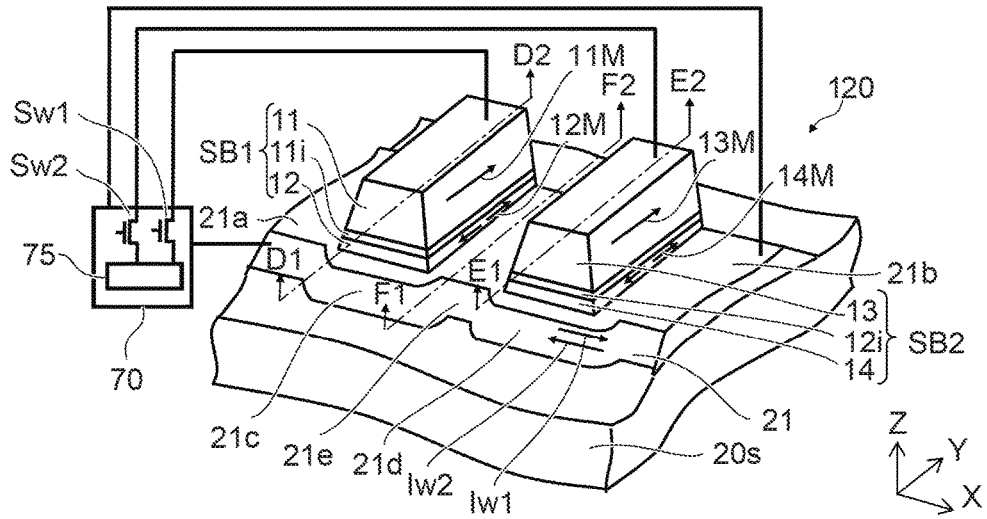
FIG. 6A to FIG. 6D are schematic views illustrating a magnetic memory device according to a second embodiment.
Figure 6B:
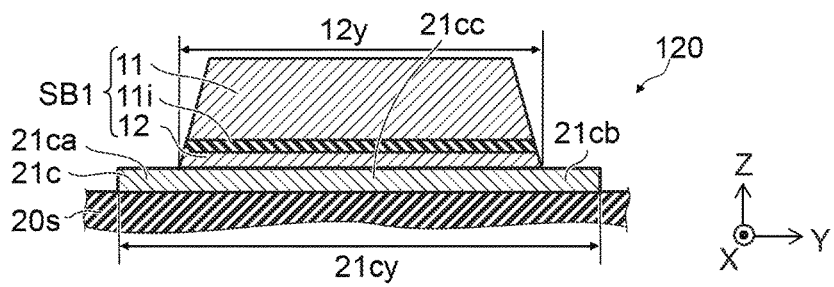
Figure 6C:
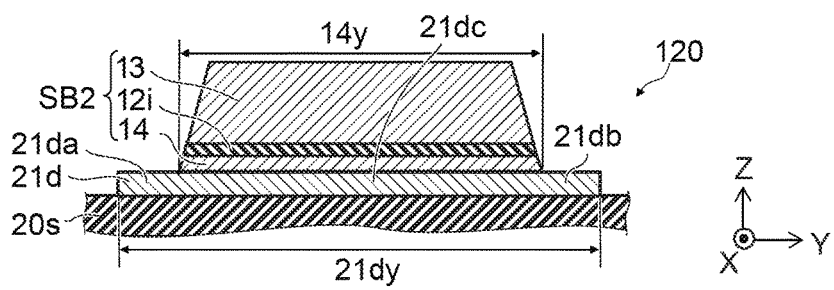
Figure 6D:
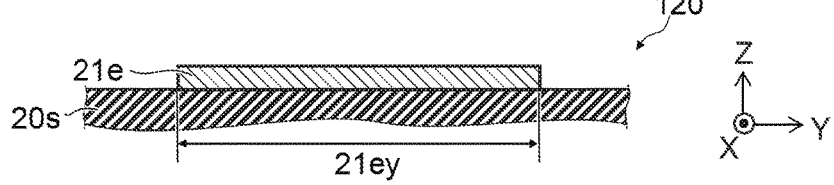

FIG. 6A is a perspective view. FIG. 6B is a line D1-D2 cross-sectional view of FIG. 6A. FIG. 6C is a line E1-E2 cross-sectional view of FIG. 6A. FIG. 6D is a line F1-F2 cross-sectional view of FIG. 6A.

As shown in FIG. 6A to FIG. 6D, the magnetic memory device 120 according to the embodiment also includes the metal-containing layer 21, the first to fourth magnetic layers 11 to 14, the first intermediate layer 11i, the second intermediate layer 12i, and the controller 70.

In the example as well, the metal-containing layer 21 is provided on the base member 20s. The metal-containing layer 21 includes the first to fifth portions 21a to 21e. The third portion 21c is positioned between the first portion 21a and the second portion 21b. The fourth portion 21d is positioned between the third portion 21c and the second portion 21b. The fifth portion 21e is positioned between the third portion 21c and the fourth portion 21d.

The first magnetic layer 11 is separated from the third portion 21c in the first direction (e.g., the Z-axis direction). The first direction crosses the second direction (e.g., the X-axis direction) from the first portion 21a toward the second portion 21b. The second magnetic layer 12 is provided between the first magnetic layer 11 and a portion of the third portion 21c. The first intermediate layer 11i includes a portion provided between the first magnetic layer 11 and the second magnetic layer 12. The first intermediate layer 11i is nonmagnetic. The first magnetic layer 11, the second magnetic layer 12, and the first intermediate layer 11i are included in the first stacked body SB1.

The third magnetic layer 13 is separated from the fourth portion 21d in the first direction (the Z-axis direction). The fourth magnetic layer 14 is provided between the third magnetic layer 13 and a portion of the fourth portion 21d. The second intermediate layer 12i includes a portion provided between the third magnetic layer 13 and the fourth magnetic layer 14. The second intermediate layer 12i is nonmagnetic. The third magnetic layer 13, the fourth magnetic layer 14, and the second intermediate layer 12i are included in the second stacked body SB2.

The controller 70 is electrically connected with the first portion 21a, the second portion 21b, the first magnetic layer 11, and the third magnetic layer 13. In the example as well, the first switch element Sw1 is provided in the current path between the first magnetic layer 11 and the drive circuit 75 of the controller 70. The second switch element Sw2 is provided in the current path between the drive circuit 75 and the third magnetic layer 13.

In the example as well, in the first program operation, the controller 70 forms the first state by supplying, to the metal-containing layer 21, the first program current Iw1 from the first portion 21a toward the second portion 21b. In the second program operation, the controller 70 forms the second state by supplying, to the metal-containing layer 21, the second program current Iw2 from the second portion 21b toward the first portion 21a. The first electrical resistance between the first magnetic layer 11 and the first portion 21a in the first state is different from the second electrical resistance between the first magnetic layer 11 and the first portion 21a in the second state.

The controller 70 forms the third state by supplying the first program current Iw1 to the metal-containing layer 21. The controller 70 forms the fourth state by supplying the second program current Iw2 to the metal-containing layer 21. The third electrical resistance between the third magnetic layer 13 and the first portion 21a in the third state is different from the fourth electrical resistance between the third magnetic layer 13 and the first portion 21a in the fourth state.

In the read operation, the controller 70 may sense a characteristic (which may be a voltage, a current, or the like) corresponding to the electrical resistance between the first magnetic layer 11 and the first portion 21a. In the read operation, the controller 70 may sense a characteristic (which may be a voltage, a current, or the like) corresponding to the electrical resistance between the third magnetic layer 13 and the first portion 21a.

In the example as shown in FIG. 6A, the width in the Y-axis direction of the metal-containing layer 21 is different between the third portion 21c and the fifth portion 21e. Also, the width in the Y-axis direction of the metal-containing layer 21 is different between the fourth portion 21d and the fifth portion 21e. Otherwise, for example, the configuration described in reference to the magnetic memory device 110 is applicable to the magnetic memory device 120.

An example of the width in the Y-axis direction of the metal-containing layer 21 will now be described.

As shown in FIG. 6A, the third portion 21c of the metal-containing layer 21 protrudes in the Y-axis direction using the second magnetic layer 12 as a reference.

For example, as shown in FIG. 6B, a length 21cy is the length along the third direction (e.g., the Y-axis direction) of the third portion 21c. The third direction crosses the first direction (the Z-axis direction) and the second direction (the X-axis direction). For example, the third direction crosses a plane including the first direction (the Z-axis direction) and the second direction (the X-axis direction). On the other hand, a length 12y is the length along the third direction of the second magnetic layer 12. The length 12y is, for example, the average of the length 12yL and the length 12yU described above. The length 21cy is longer than the length 12y.

On the other hand, as shown in FIG. 6D, a length 21ey is the length along the third direction of the fifth portion 21e of the metal-containing layer 21.

A length 12cy of the third portion 21c of the metal-containing layer 21 recited above is longer than the length 21ey along the third direction of the fifth portion 21e recited above.

On the other hand, as shown in FIG. 6C, a length 21dy along the third direction of the fourth portion 21d of the metal-containing layer 21 is longer than a length 14y along the third direction of the fourth magnetic layer 14. The length 21dy of the fourth portion 21d recited above is longer than the length 21ey of the fifth portion 21e recited above (referring to FIG. 6D).

Thus, the widths along the Y-axis direction of the metal-containing layer 21 at the portions (the third portion 21c and the fourth portion 21d) where the stacked bodies are provided are wider than the width along the Y-axis direction of the metal-containing layer 21 at the portion (the fifth portion 21e) where the stacked body is not provided.

For example, a third reference example may be considered in which the width in the Y-axis direction of the metal-containing layer 21 is constant. For example, the conductance in the regions of the metal-containing layer 21 overlapping the stacked bodies is higher than the conductance in the region of the metal-containing layer 21 not overlapping the stacked body. Therefore, in the third reference example, the current concentrates easily at the Y-axis direction ends of the metal-containing layer 21 compared to the central portion in the Y-axis direction. For example, the dispersion (the fluctuation) in the direction of the recording current due to the current concentration causes dispersion (fluctuation) in the direction of the spin current. As a result, the dispersion of the spin coherence becomes large; and the recording current increases.

Conversely, in the embodiment, the widths along the Y-axis direction of the regions of the metal-containing layer 21 overlapping the stacked bodies are set to be locally wide. For example, the protruding portions (the first non-overlap region 21ca and the second non-overlap region 21cb) are provided in the third portion 21c. The protruding portions are used as spin localization regions. Thereby, compared to the third reference example recited above, the current concentration at the Y-axis direction ends of the metal-containing layer 21 can be suppressed. For example, the distribution of the program current is uniform. Thereby, the effect of the spin-orbit torque is obtained effectively. For example, the control of the second magnetization 12M of the second magnetic layer 12 by the program current is performed efficiently.

Thereby, for example, the magnetic memory device can be provided in which the program current can be reduced. In the embodiment as well, the bit density can be increased.

For example, the difference of the widths such as that recited above is due to the non-overlap regions provided in the third portion 21c and the fourth portion 21d.

In other words, the third portion 21c includes the first overlap region 21cc, the first non-overlap region 21ca, and the second non-overlap region 21cb. The first overlap region 21cc overlaps the second magnetic layer 12 in the first direction (the Z-axis direction). The first non-overlap region 21ca does not overlap the second magnetic layer 12 in the first direction. The second non-overlap region 21cb does not overlap the second magnetic layer 12 in the first direction. The direction from the first non-overlap region 21ca toward the second non-overlap region 21cb is aligned with the third direction (the Y-axis direction). The first overlap region 21cc is positioned between the first non-overlap region 21ca and the second non-overlap region 21cb in the third direction.

Similarly, the fourth portion 21d includes the second overlap region 21dc, the third non-overlap region 21da, and the fourth non-overlap region 21db. The second overlap region 21dc overlaps the fourth magnetic layer 14 in the first direction (the Z-axis direction). The third non-overlap region 21da does not overlap the fourth magnetic layer 14 in the first direction. The fourth non-overlap region 21db does not overlap the fourth magnetic layer 14 in the first direction. The direction from the third non-overlap region 21da toward the fourth non-overlap region 21db is aligned with the third direction (the Y-axis direction). The second overlap region 21dc is positioned between the third non-overlap region 21da and the fourth non-overlap region 21db in the third direction.

In the embodiment, the thicknesses of the non-overlap regions may be the same as the thickness of the overlap region. In the embodiment, the thicknesses of the non-overlap regions may be thicker than the thickness of the overlap region. As described below, the thicknesses of the non-overlap regions may be thinner than the thickness of the overlap region.

Figure 7:
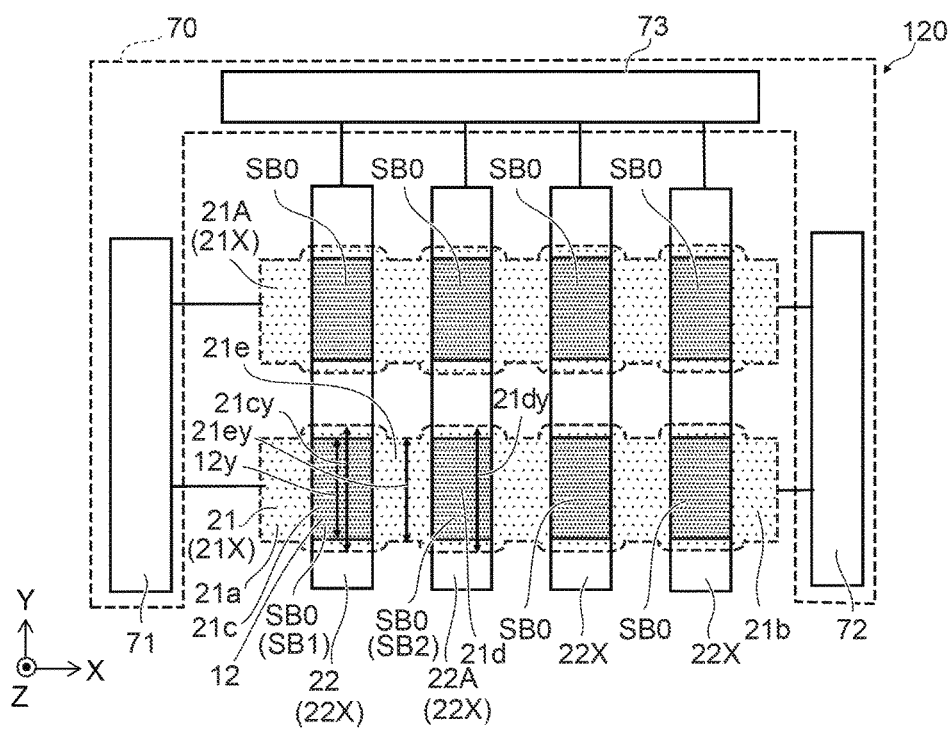
FIG. 7 is a schematic plan view illustrating the magnetic memory device according to the second embodiment.

FIG. 7 is a schematic plan view illustrating the magnetic memory device according to the second embodiment.

As shown in FIG. 7, the multiple electrodes 22X and the multiple metal-containing layers 21X may be provided in the magnetic memory device 120. The multiple electrodes 22X and the multiple metal-containing layers 21X are as described in reference to FIG. 3B. For example, the stacked bodies SB0 are provided between the multiple electrodes 22X and the multiple metal-containing layers 21X. For example, the first stacked body SB1 is provided between the metal-containing layer 21 and the electrode 22. The second stacked body SB2 is provided between the metal-containing layer 21 and the electrode 22A.

In the example, the position of the end of the fifth portion 21e of the metal-containing layer 21 is substantially aligned with the position of the end of the second magnetic layer 12 (the position of the end of the first stacked body SB1). For example, the length 21ey along the third direction (the Y-axis direction) of the fifth portion 21e is not less than 0.9 times and not more than 1.1 times the length 12y along the third direction of the second magnetic layer 12.

One stacked body SB1 may be provided in the embodiment. For example, the magnetic memory device 120 shown in FIG. 6A may include the metal-containing layer 21, the first magnetic layer 11, the second magnetic layer 12, the first intermediate layer 11i, and the controller 70. In such a case as well, the length 21cy of the third portion 21c along the third direction (the Y-axis direction) crossing the first direction and the second direction (referring to FIG. 6B) is longer than the length 12y along the third direction of the second magnetic layer 12. The length 21cy of the third portion 21c is longer than the length (e.g., the length 21ey shown in FIG. 6D) along the third direction of a portion (which may be, for example, the fifth portion 21e shown in FIG. 6A) between the third portion 21c and the second portion 21b. In such a case as well, the controller 70 implements the first and second program operations recited above. In such a case as well, the first electrical resistance between the first magnetic layer 11 and one of the first portion 21a or the second portion 21b after the first program operation is different from the second electrical resistance between the first magnetic layer 11 and the one of the first portion 21a or the second portion 21b recited above after the second program operation. In such a magnetic memory device as well, a magnetic memory device can be provided in which the bit density can be increased.

Figure 8A:
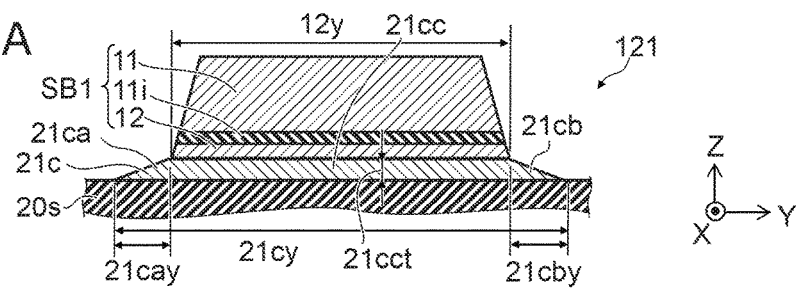
FIG. 8A and FIG. 8B are schematic cross-sectional views illustrating a magnetic memory device according to the second embodiment.
Figure 8B:
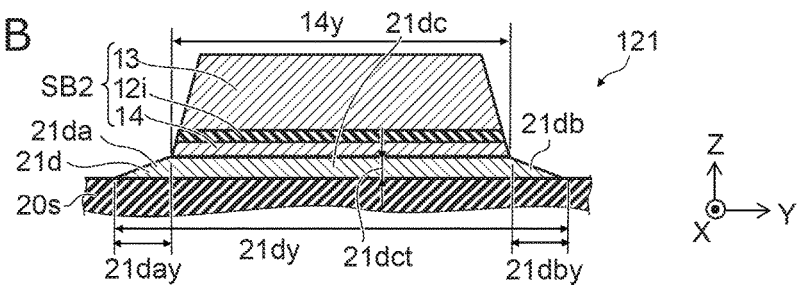

FIG. 8A and FIG. 8B are schematic cross-sectional views illustrating a magnetic memory device according to the second embodiment.

FIG. 8A is a cross-sectional view corresponding to line D1-D2 of FIG. 6A. FIG. 8B is a cross-sectional view corresponding to line E1-E2 of FIG. 6A.

In the other magnetic memory device 121 according to the embodiment as shown in FIG. 8A, the third portion 21c of the metal-containing layer 21 includes the first overlap region 21cc, the first non-overlap region 21ca, and the second non-overlap region 21cb. In the example, the thickness along the first direction (the Z-axis direction) of at least a portion of the first non-overlap region 21ca is thinner than the first overlap region thickness 21cct along the first direction of the first overlap region 21cc. The thickness along the first direction of at least a portion of the second non-overlap region 21cb is thinner than the first overlap region thickness 21cct recited above.

As shown in FIG. 8B, the fourth portion 21d includes the second overlap region 21dc, the third non-overlap region 21da, and the fourth non-overlap region 21db. The thickness along the first direction (the Z-axis direction) of at least a portion of the third non-overlap region 21da is thinner than the second overlap region thickness 21dct along the first direction of the second overlap region 21dc. The thickness along the first direction of at least a portion of the fourth non-overlap region 21db is thinner than the second overlap region thickness 21dct recited above.

Otherwise, the magnetic memory device 121 is similar to the magnetic memory device 120.

In the magnetic memory device 121, for example, the coherency of the spin polarization can be maintained by setting the non-overlap region to be thin. The recording current can be suppressed while increasing the transfer efficiency of the spin torque. Thereby, the efficiency of the programming increases. Thereby, the program current can be reduced. Thereby, the bit density can be increased further.

In the magnetic memory device 121 as well, the first overlap region 21cc of the third portion 21c overlaps the second magnetic layer 12 in the first direction (the Z-axis direction). The first non-overlap region 21ca does not overlap the second magnetic layer 12 in the first direction. The second non-overlap region 21cb does not overlap the second magnetic layer 12 in the first direction. The direction from the first non-overlap region 21ca toward the second non-overlap region 21cb is aligned with the third direction (the Y-axis direction). The first overlap region 21cc is positioned between the first non-overlap region 21*ca* and the second non-overlap region 21*cb* in the third direction.

Similarly, the fourth portion 21*d* includes the second overlap region 21*dc*, the third non-overlap region 21*da*, and the fourth non-overlap region 21*db*. The second overlap region 21*dc* overlaps the fourth magnetic layer 14 in the first direction (the Z-axis direction). The third non-overlap region 21*da* does not overlap the fourth magnetic layer 14 in the first direction. The fourth non-overlap region 21*db* does not overlap the fourth magnetic layer 14 in the first direction. The direction from the third non-overlap region 21*da* toward the fourth non-overlap region 21*db* is aligned with the third direction (the Y-axis direction). The second overlap region 21*dc* is positioned between the third non-overlap region 21*da* and the fourth non-overlap region 21*db* in the third direction.

In the magnetic memory device 121, the ratio of the total of the length 21*cay* along the third direction (the Y-axis direction) of the first non-overlap region 21*ca* and the length 21*cby* along the third direction of the second non-overlap region 21*cb* to the first overlap region thickness 21*cct* is taken as the first ratio.

A portion of the configuration of the magnetic memory device 110 (referring to FIG. 1B) is applicable to the magnetic memory device 121. In the magnetic memory device 121 as well, the thickness of the second magnetic layer 12 (the thickness of the second magnetic layer along the first direction) is taken as the thickness t12 (referring to FIG. 1B). The length along the second direction of the surface 12L of the second magnetic layer 12 opposing the metal-containing layer 21 is taken as the length 12*x*L. The length along the second direction of the surface 12U of the second magnetic layer 12 opposing the first intermediate layer 11*i* is taken as the length 12*x*U.

For example, the first ratio recited above is higher than the ratio of the absolute value of the difference between the length 12*x*L and the length 12*x*U to the thickness t12. For example, the dispersion of the spin coherence can be suppressed by setting the width in the Y-axis direction of the non-overlap region to be large. The efficiency of the programming increases; and the program current can be reduced.

Figure 9A:
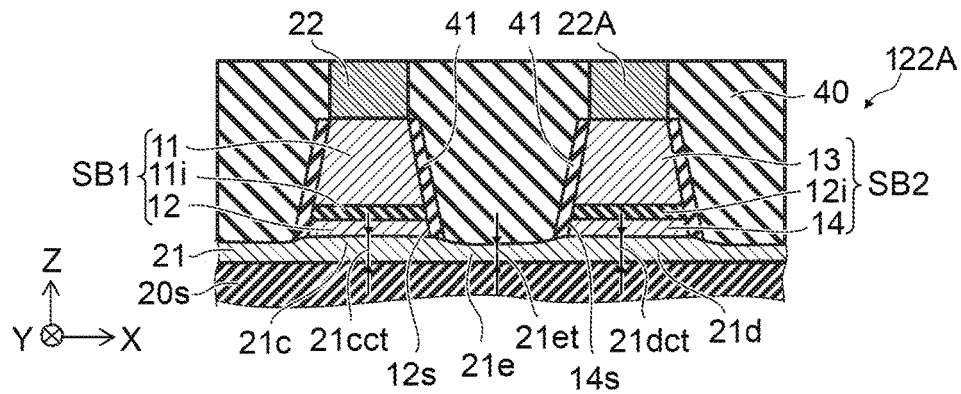
FIG. 9A to FIG. 9C are schematic cross-sectional views illustrating other magnetic memory devices according to the second embodiment.
Figure 9B:
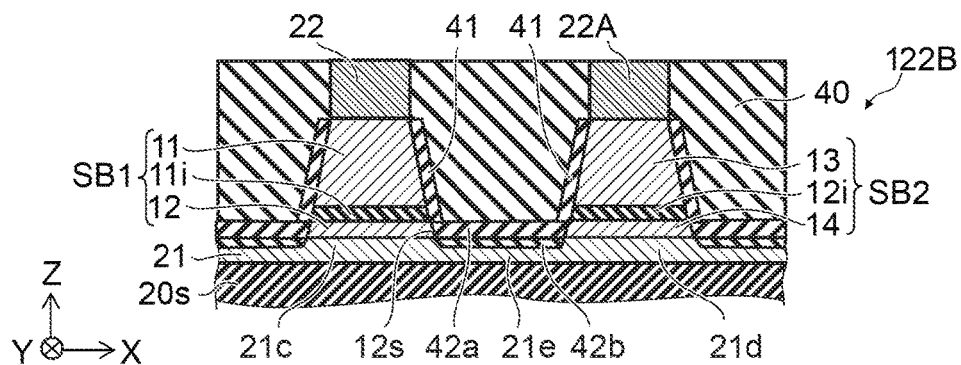
Figure 9C:
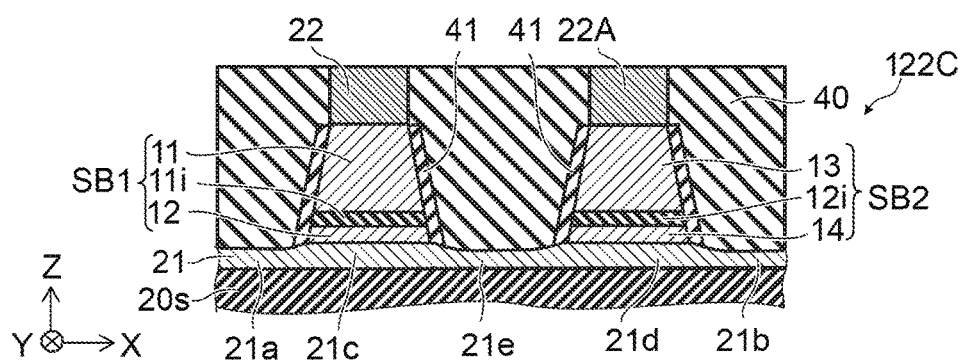

FIG. 9A to FIG. 9C are schematic cross-sectional views illustrating other magnetic memory devices according to the second embodiment.

As shown in FIG. 9A, the metal-containing layer 21, the first stacked body SB1, and the second stacked body SB2 are provided in another magnetic memory device 122A according to the embodiment as well. In the magnetic memory device 122A, the thickness 21*et* along the first direction (the Z-axis direction) of the fifth portion 21*e* of the metal-containing layer 21 is thinner than the first overlap region thickness 21*cct*. The thickness 2*let* is thinner than the second overlap region thickness 21*dct*. For example, the spin coherence is improved by providing such a difference between the thicknesses.

The compound layer 41 is provided in the example. The compound layer 41 includes a compound including a metal included in the second magnetic layer 12 (or the fourth magnetic layer 14). The compound layer 41 opposes the side surface 12*s* of the second magnetic layer 12. The compound layer 41 opposes the side surface 14*s* of the fourth magnetic layer 14. For example, the leakage current at the side surfaces of the stacked body can be suppressed by the compound layer 41.

As shown in FIG. 9B, the first compound region 42*a* (the compound layer) is provided in another magnetic memory device 122B according to the embodiment. The first compound region 42*a* includes a compound including a metal included in the second magnetic layer 12 (or the fourth magnetic layer 14). The first compound region 42*a* opposes the side surface 12*s* of the second magnetic layer 12 and the side surface 14*s* of the fourth magnetic layer 14. The first compound region 42*a* is provided to be continuous between the second magnetic layer 12 and the fourth magnetic layer 14.

The second compound region 42*b* may be provided between the first compound region 42*a* and the fifth portion 21*e*. The second compound region 42*b* includes, for example, an oxide, nitride, or oxynitride of a metal included in the metal-containing layer 21.

In another magnetic memory device 122C according to the embodiment shown in FIG. 9C, the crystal structure of the third portion 21*c* of the metal-containing layer 21 is different from the crystal structure of the other portions (e.g., the first portion 21*a*, the second portion 21*b*, the fifth portion 21*e*, etc.) of the metal-containing layer 21.

For example, the crystal structure of the third portion 21*c* of the metal-containing layer 21 is the β-phase. The crystal structure of at least a portion (e.g., the surface portion) of the other portions (e.g., the first portion 21*a*, the second portion 21*b*, the fifth portion 21*e*, etc.) of the metal-containing layer 21 is the α-phase.

For example, per unit volume (unit surface area), the proportion of the β-phase region of the third portion 21*c* to the entire third portion 21*c* is higher than, for example, the proportion of the β-phase region of the other regions (e.g., the first portion 21*a*, the second portion 21*b*, the fifth portion 21*e*, etc.) to the entire other regions.

For example, at least a portion of the third portion 21*c* includes β-phase Ta. For example, at least a portion of the first portion 21*a* (or the fifth portion 21*e*) includes α-phase Ta. For example, a high spin Hall effect is obtained; and the program current can be reduced. The resistance of the metal-containing layer 21 can be low.

FIG. 10A to FIG. 10D are schematic plan views illustrating other magnetic memory devices according to the second embodiment.

Figure 10A:
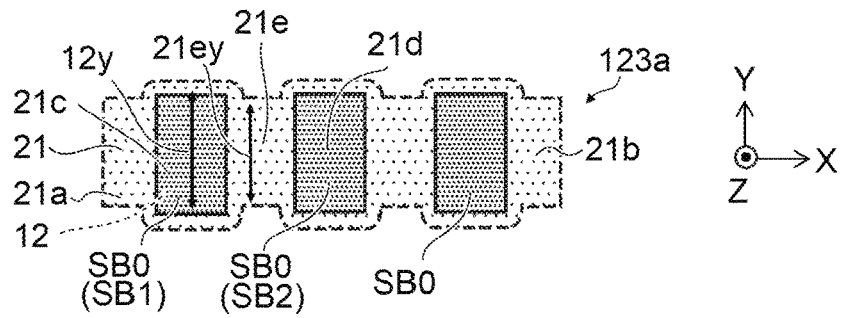
FIG. 10A to FIG. 10D are schematic plan views illustrating other magnetic memory devices according to the second embodiment.

In a magnetic memory device 123*a* as shown in FIG. 10A, the length 21*ey* along the third direction (the Y-axis direction) of the fifth portion 21*e* is substantially the same as the length 12*y* along the third direction of the second magnetic layer 12. For example, the length 21*ey* is not less than 0.9 times and not more than 1.1 times the length 12*y*.

Figure 10B:
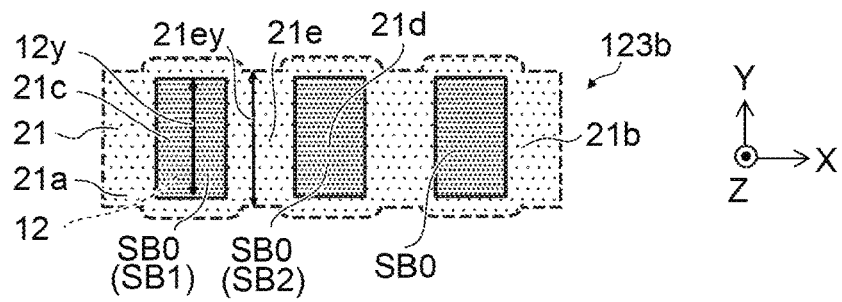

In a magnetic memory device 123*b* as shown in FIG. 10B, the length 21*ey* along the third direction (the Y-axis direction) of the fifth portion 21*e* is longer than the length 12*y* along the third direction of the second magnetic layer 12.

Figure 10C:
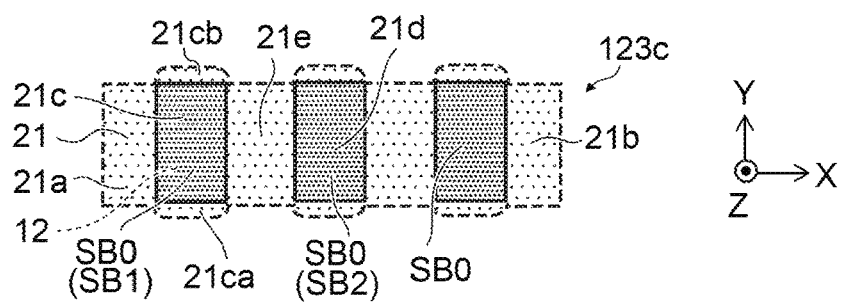

In a magnetic memory device 123*c* as shown in FIG. 10C, the width in the second direction (the X-axis direction) of the first non-overlap region 21*ca* is substantially the same as the width along the second direction of the second magnetic layer 12. For example, the width in the second direction of the first non-overlap region 21*ca* is not less than 0.9 times and not more than 1.1 times the width along the second direction of the second magnetic layer 12.

Figure 10D:
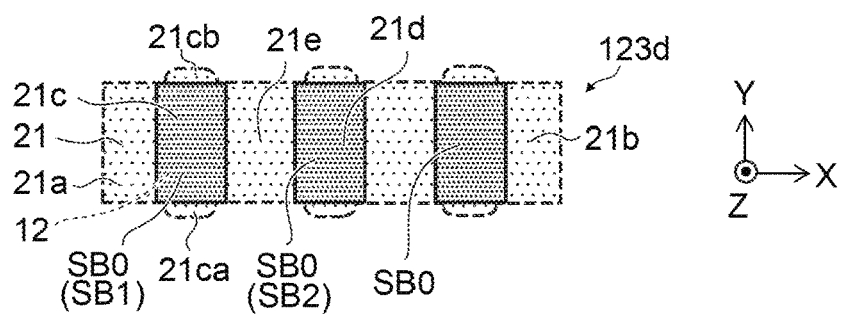

In a magnetic memory device 123*d* as shown in FIG. 10D, the width in the second direction (the X-axis direction) of the first non-overlap region 21*ca* is narrower than the width along the second direction of the second magnetic layer 12.

Third Embodiment

A third embodiment relates to a method for manufacturing the magnetic memory device according to the second embodiment.

Figure 11:
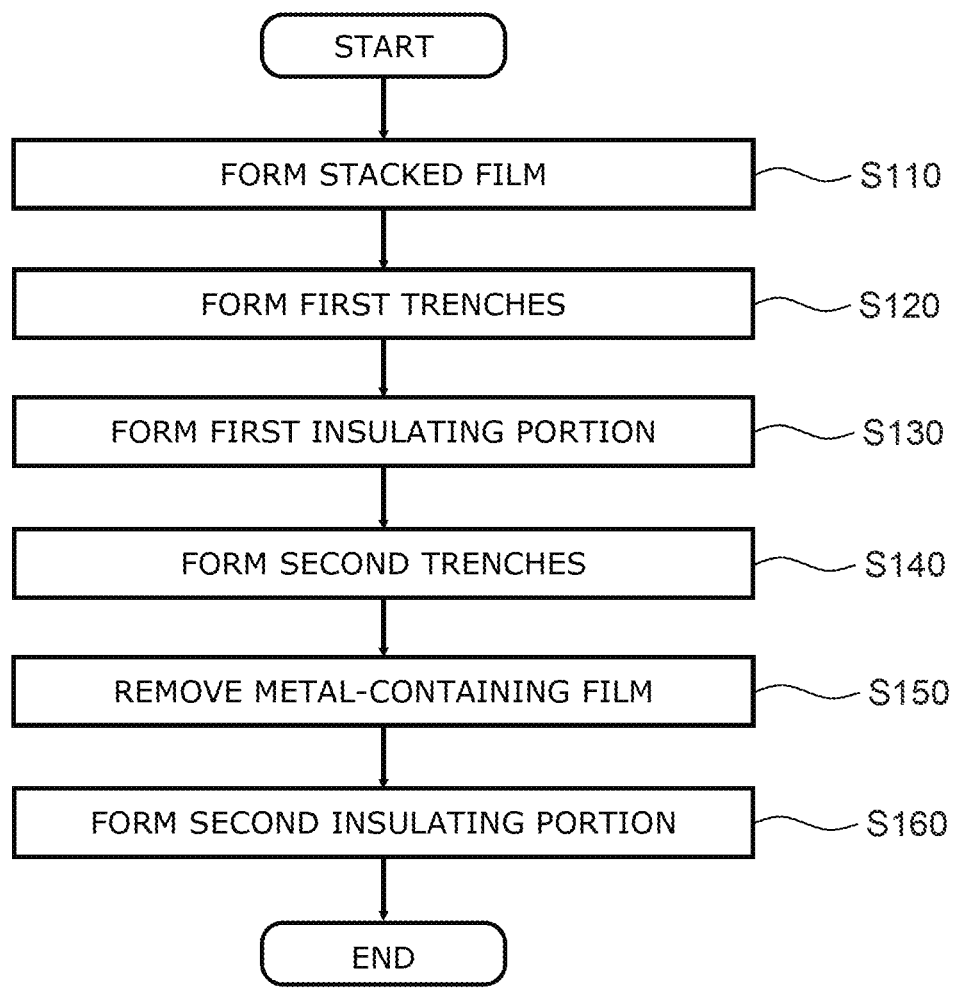
FIG. 11 is a flowchart illustrating a method for manufacturing a magnetic memory device according to a third embodiment.

FIG. 11 is a flowchart illustrating the method for manufacturing the magnetic memory device according to the third embodiment.

FIG. 12A to FIG. 12D, FIG. 13A to FIG. 13E, FIG. 14A to FIG. 14C, FIG. 15A, and FIG. 15B are schematic views illustrating the method for manufacturing the magnetic memory device according to the third embodiment.

FIG. 12A, FIG. 12C, FIG. 13D, FIG. 14A to FIG. 14C, FIG. 15A, and FIG. 15B are schematic plan views. FIG. 12B, FIG. 12D, FIG. 13A to FIG. 13C, and FIG. 13E are schematic cross-sectional views.

As shown in FIG. 11, a stacked film is formed on a metal-containing film provided on the base member 20s (step S110).

Figure 12A:
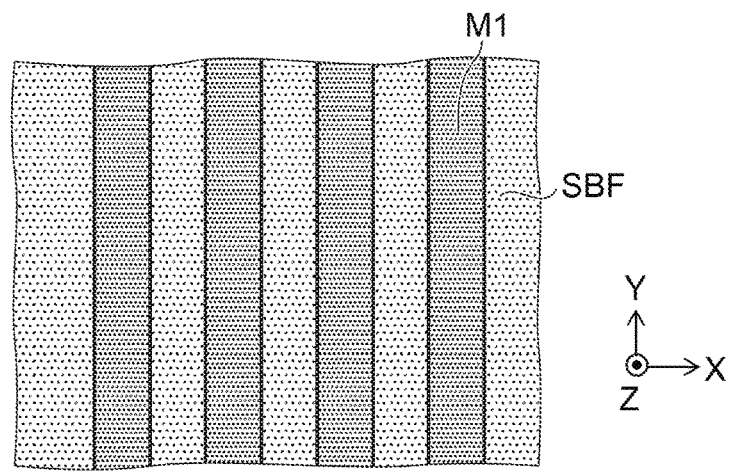
FIG. 12A to FIG. 12D are schematic views illustrating the method for manufacturing the magnetic memory device according to the third embodiment.
Figure 12B:
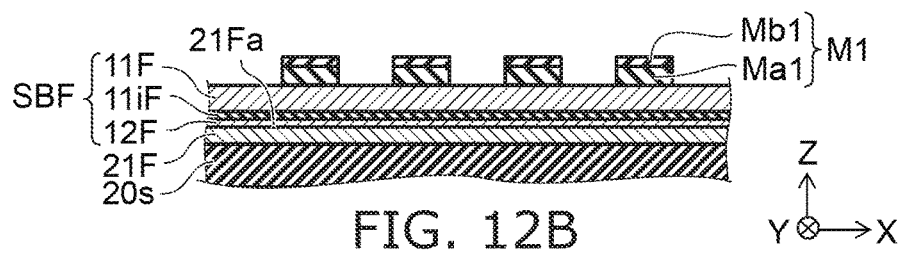

For example, as shown in FIG. 12B, a metal-containing film 21F (e.g., a Ta film) is provided on the base member 20s (e.g., an aluminum oxide substrate).

The first direction (the Z-axis direction) is a direction perpendicular to a surface 21Fa of the metal-containing film 21F. The X-axis direction is one direction perpendicular to the Z-axis direction. The Y-axis direction is a direction perpendicular to the Z-axis direction and the X-axis direction.

The metal-containing film 21F is used to form the metal-containing layer 21. A stacked film SBF is provided on the metal-containing film 21F. The stacked film SBF includes a first magnetic film 11F, a second magnetic film 12F, and an intermediate film 11iF. The second magnetic film 12F is provided between the first magnetic film 11F and the metal-containing film 21F. The intermediate film 11iF is provided between the first magnetic film 11F and the second magnetic film 12F. The intermediate film 11iF is nonmagnetic.

A first mask M1 is further formed on the stacked film SBF. The first mask M1 includes, for example, a tungsten film Mb1 (e.g., having a thickness not less than 25 nm and not more than 35 nm) and a ruthenium film Ma1 (e.g., having a thickness not less than 1 nm and not more than 3 nm). The ruthenium film Ma1 is provided between the tungsten film Mb1 and the stacked film SBF.

As shown in FIG. 12A, the first mask M1 has a configuration of multiple band configurations extending in the Y-axis direction. The stacked film SBF is exposed in the openings of the first mask M1. The first mask M1 may be formed by, for example, double patterning technology.

Figure 12C:
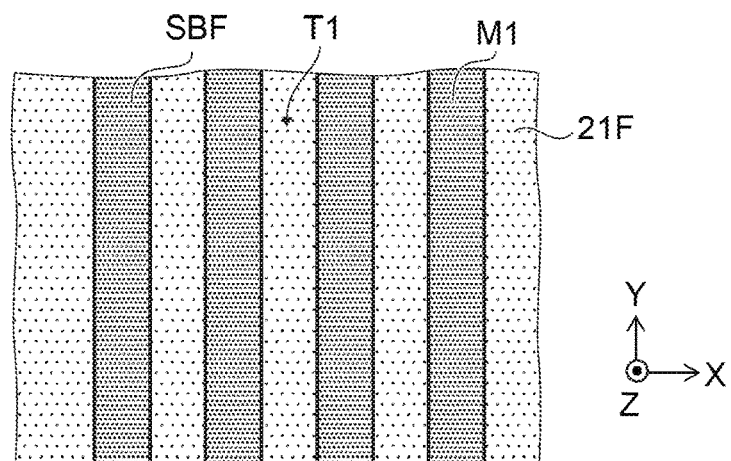
Figure 12D:
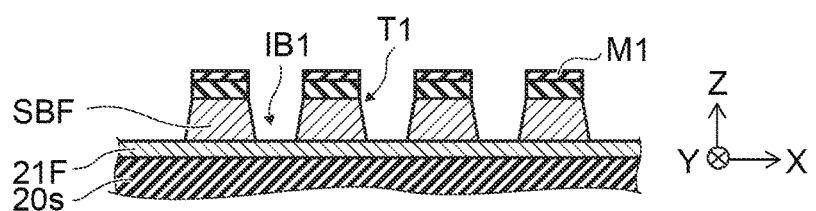

As shown in FIG. 12C and FIG. 12D, the stacked film SBF is patterned using the first mask M1. For example, an ion beam IB1 is irradiated. A portion of the stacked film SBF is removed. The metal-containing film 21F remains. Thereby, multiple first trenches T1 are formed. The multiple first trenches T1 are arranged in the second direction (the X-axis direction) crossing the first direction. The multiple first trenches T1 extend along the third direction (in the example, the Y-axis direction). The third direction crosses the first direction and the second direction. For example, the third direction crosses a plane including the first direction and the second direction. The first trenches T1 reach the metal-containing film 21F. The stacked film SBF is divided by the first trenches T1.

Thus, in the manufacturing method, the multiple first trenches T1 are formed (step S120 referring to FIG. 11).

Figure 13A:
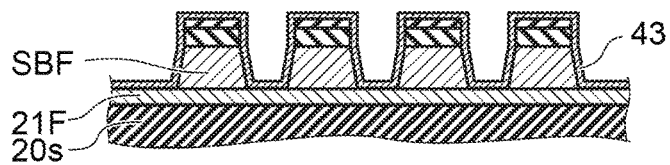
FIG. 13A to FIG. 13E are schematic views illustrating the method for manufacturing the magnetic memory device according to the third embodiment.

For example, plasma processing is performed as shown in FIG. 13A. Thereby, a compound film 43 is formed on the side wall of the stacked film SBF. The plasma processing is oxygen plasma processing or nitrogen plasma processing. For example, the compound film 43 includes a compound including an element included in the metal-containing film 21F. The compound film 43 is, for example, a protective film.

Figure 13B:
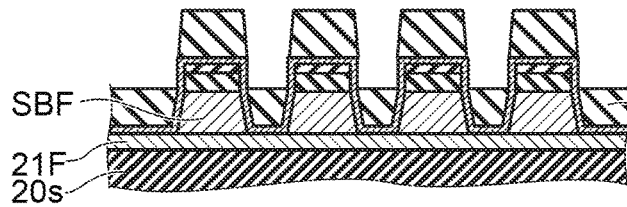

As shown in FIG. 13B, a first insulating film 44a is formed inside the first trenches T1. The first insulating film 44a is, for example, a SiN film.

Figure 13C:
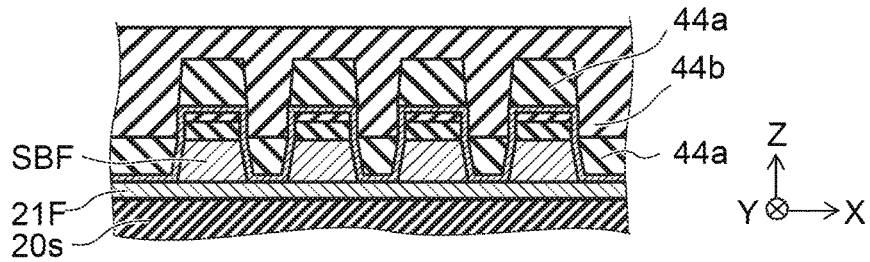

A second insulating film 44b is formed as shown in FIG. 13C. The second insulating film 44b is, for example, a stacked film including an aluminum oxide film and a silicon oxide film. Subsequently, planarization is performed.

Figure 13D:
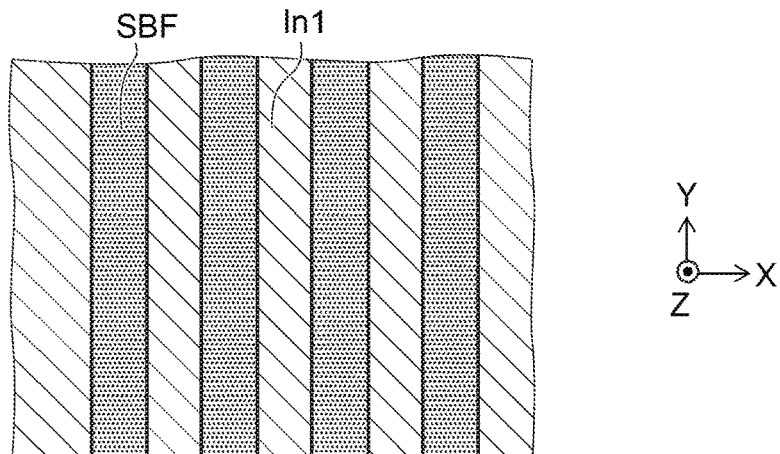
Figure 13E:
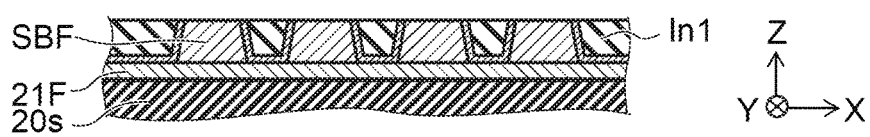

Thereby, a first insulating portion In1 is formed inside the first trenches T1 as shown in FIG. 13D and FIG. 13E. The first insulating portion In1 includes, for example, the compound film 43 recited above. The first insulating portion In1 includes the first insulating film 44a recited above. The first insulating portion In1 may include the second insulating film 44b recited above.

The formation of the first insulating portion In1 corresponds to step S130 of FIG. 11.

Subsequently, multiple second trenches are formed as shown in FIG. 11 (step S140 referring to FIG. 11).

Figure 14A:
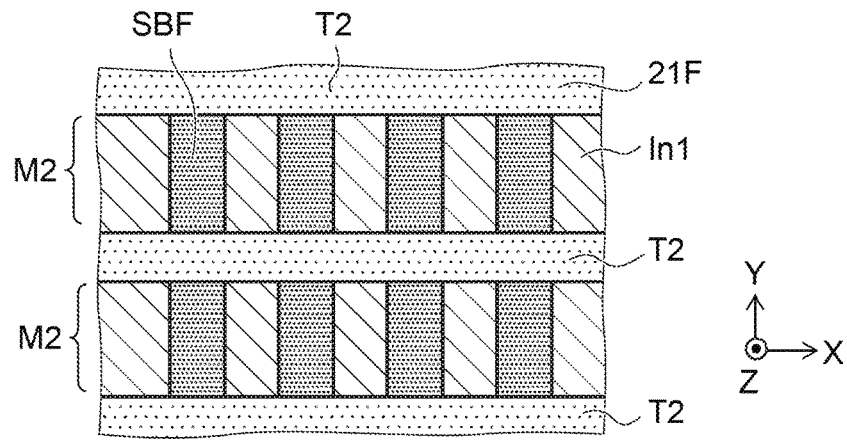
FIG. 14A to FIG. 14C are schematic views illustrating the method for manufacturing the magnetic memory device according to the third embodiment.

For example, as shown in FIG. 14A, a second mask M2 is formed on the patterning body. The second mask M2 has a configuration of multiple band configurations extending along the second direction (the X-axis direction). The patterning body is patterned using the second mask M2. For example, a portion of the first insulating portion In1 and a portion of the stacked film SBF after the formation of the first insulating portion In1 that are exposed in the openings of the second mask M2 are removed. Thereby, multiple second trenches T2 are formed. The multiple second trenches T2 extend in the second direction (e.g., the X-axis direction). As described above, the direction (the third direction) in which the multiple first trenches T1 extend crosses the first direction and the second direction. The second direction may be tilted with respect to the third direction; or the second direction may be perpendicular to the third direction.

For example, the width in the Y-axis direction of the second mask M2 can be changed by processing (e.g., the irradiation of an ion beam) using the second mask M2. For example, slimming of the second mask M2 is performed. In the processing, for example, a difference of the etching rates can be caused between the stacked film SBF and the first insulating portion In1. Thereby, for example, the width in the Y-axis direction of one stacked film SBF can be set to be wider than the width in the Y-axis direction of the first insulating portion In1.

Figure 14B:
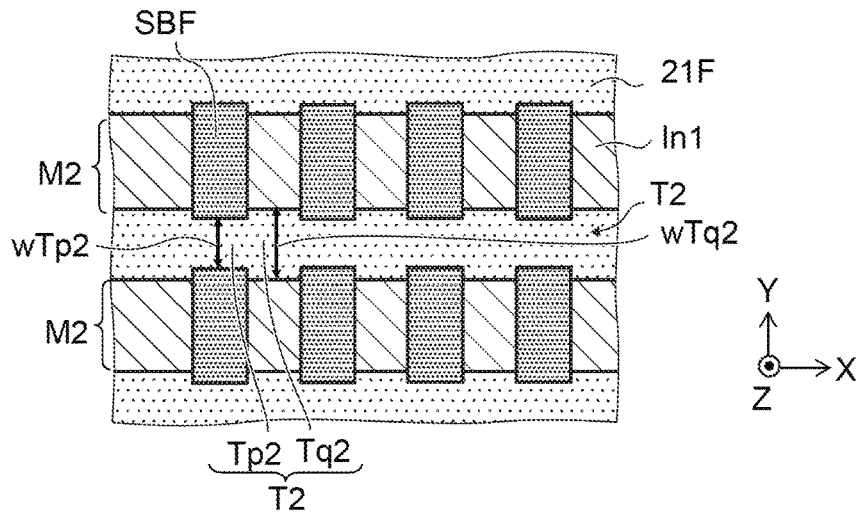

For example, as shown in FIG. 14B, one of the multiple second trenches T2 includes a first trench region Tp2 and a second trench region Tq2. The first trench region Tp2 overlaps the stacked film SBF in the third direction (the Y-axis direction). The second trench region Tq2 overlaps the first insulating portion In1 in the third direction (the Y-axis direction). A width wTp2 along the third direction of the first trench region Tp2 is narrower than a width wTq2 along the third direction of the second trench region Tq2.

Subsequently, as shown in FIG. 11, the metal-containing film 21F that is exposed at the multiple second trenches T2 is removed (step S150). A second insulating portion is formed inside the multiple second trenches T2 (step S160).

Figure 14C:
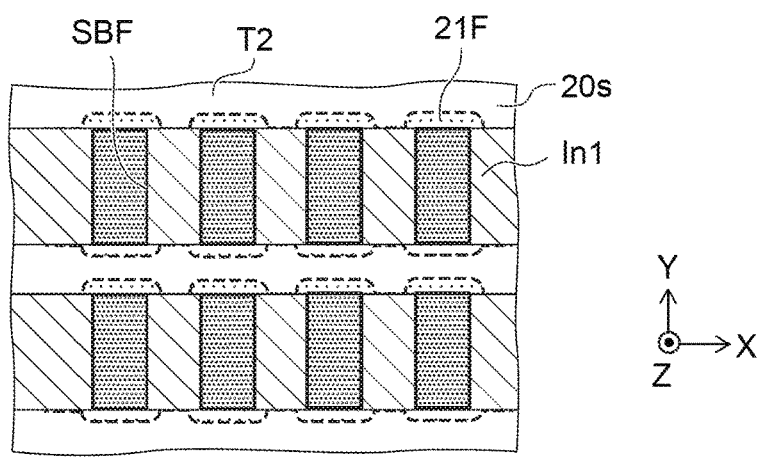

For example, as shown in FIG. 14C, the metal-containing film 21F that is exposed at the multiple second trenches T2 is removed. The base member 20s that is provided under the removed metal-containing film 21F is exposed.

Figure 15A:
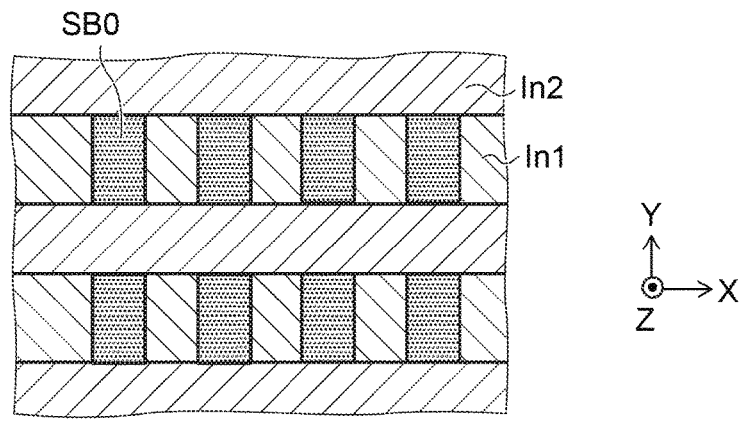
FIG. 15A and FIG. 15B are schematic views illustrating the method for manufacturing the magnetic memory device according to the third embodiment.

As shown in FIG. 15A, the second insulating portion In2 is formed inside the multiple second trenches T2. In such a case, the material of the second insulating portion In2 may be different from the material of the first insulating portion In1. For example, the first insulating portion In1 includes silicon nitride; and the second insulating portion In2 includes silicon oxide. For example, the first insulating portion In1 includes silicon nitride; and the second insulating portion In2 includes aluminum oxide.

For example, there is a difference between the stress occurring in the different materials. For example, mutually-different stress can be obtained by using mutually-different materials as the two insulating portions. For example, mutually-different stress is generated in the X-axis direction and the Y-axis direction in the second magnetic layer 12 and the fourth magnetic layer 14. Thereby, uniaxial anisotropy can be provided in these magnetic layers. Thereby, the magnetizations of these magnetic layers are stabilized. A stable memory operation is obtained.

Figure 15B:
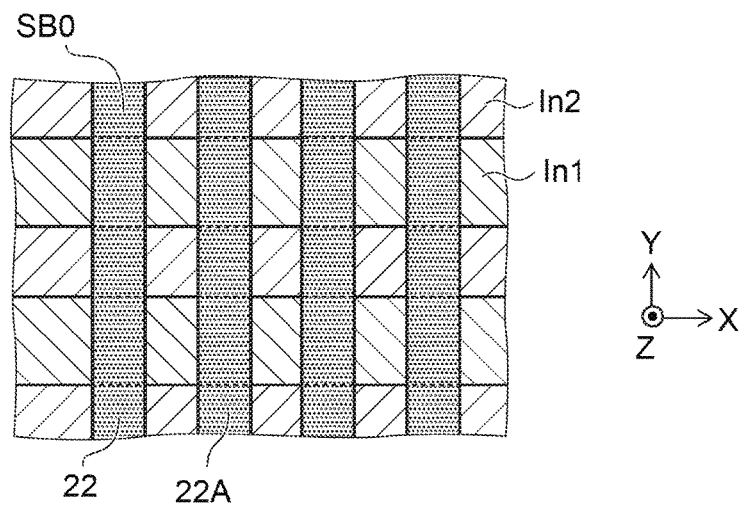

As shown in FIG. 15B, a magnetic memory device is made in which the electrode 22, the electrode 22A, etc., are formed.

Fourth Embodiment

Figure 16:
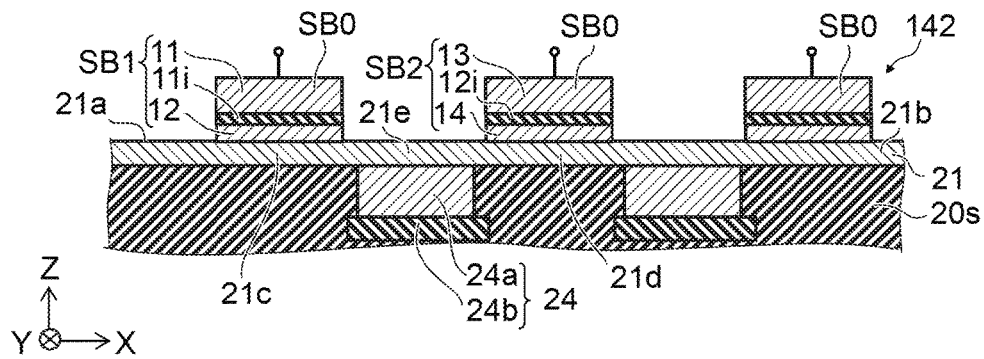
FIG. 16 is a schematic cross-sectional view illustrating a magnetic memory device according to a fourth embodiment.

FIG. 16 is a schematic cross-sectional view illustrating a magnetic memory device according to a fourth embodiment.

As shown in FIG. 16, a conductive portion 24 is provided in the magnetic memory device 142 according to the embodiment. Otherwise, for example, at least portions of the configurations described in reference to the magnetic memory devices 110, 120, etc., are applicable to the magnetic memory device 142.

For example, the conductive portion 24 is electrically connected with the fifth portion 21e. For example, the conductive portion 24 contacts the fifth portion 21e. The metal-containing layer 21 is provided between the position of the stacked body SB0 and the position of the conductive portion 24 in the Z-axis direction. For example, the multiple stacked bodies SB0 are provided on the upper surface of the metal-containing layer 21. For example, the conductive portion 24 is provided on the lower surface of the metal-containing layer 21.

By providing the conductive portion 24, the resistance between the first portion 21a and the second portion 21b of the metal-containing layer 21 can be reduced.

In the example, the conductive portion 24 includes a first conductive layer 24a and a second conductive layer 24b. The first conductive layer 24a is provided between the metal-containing layer 21 and the second conductive layer 24b. The first conductive layer 24a includes, for example, at least one of copper, tungsten, titanium nitride, or carbon. The second conductive layer 24b includes, for example, at least one of copper, tungsten, titanium nitride, or carbon.

Figure 17:
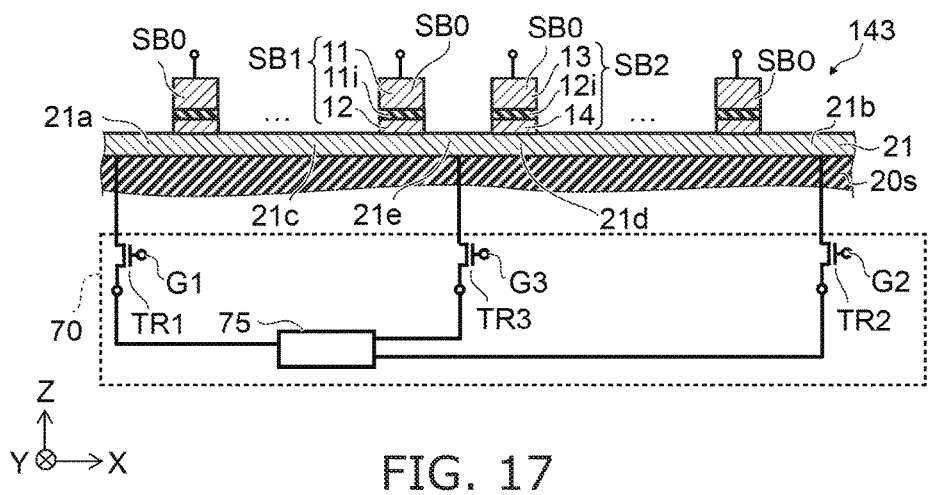
FIG. 17 is a schematic view illustrating another magnetic memory device according to the fourth embodiment.

FIG. 17 is a schematic view illustrating another magnetic memory device according to the fourth embodiment.

As shown in FIG. 17, first to fourth transistors TR1 to TR3 are provided in the other magnetic memory device 143 according to the embodiment. Otherwise, for example, at least portions of the configurations described in reference to the magnetic memory devices 110, 120, etc., are applicable to the magnetic memory device 143.

One end of the first transistor TR1 is electrically connected with the first portion 21a of the metal-containing layer 21. Another end of the first transistor TR1 is electrically connected with the drive circuit 75. One end of the second transistor TR2 is electrically connected with the second portion 21b of the metal-containing layer 21. Another end of the second transistor TR2 is electrically connected with the drive circuit 75. One end of the third transistor TR3 is electrically connected with the fifth portion 21e of the metal-containing layer 21. Another end of the third transistor TR3 is electrically connected with the drive circuit 75. For example, these transistors are included in the controller 70. These transistors may be considered to be provided separately from the controller 70.

The desired current (the program current) of the metal-containing layer 21 is caused to flow according to the potentials of a first gate G1 of the first transistor TR1, a second gate G2 of the second transistor TR2, and a third gate G3 of the third transistor TR3.

For example, the program current flows from the first portion 21a toward the fifth portion 21e. For example, the program current flows from the fifth portion 21e toward the first portion 21a. For example, the program current flows from the second portion 21b toward the fifth portion 21e. For example, the program current flows from the fifth portion 21e toward the second portion 21b. Any combination of the directions of the currents is obtained.

The number of transistors for the control can be reduced by providing a transistor at a middle position (e.g., the fifth portion 21e) of the metal-containing layer 21. For example, a magnetic memory device having a large capacity is obtained. For example, the memory capacity for the size of the entire magnetic memory device can be increased. The bit density can be increased.

Fifth Embodiment

Figure 18:
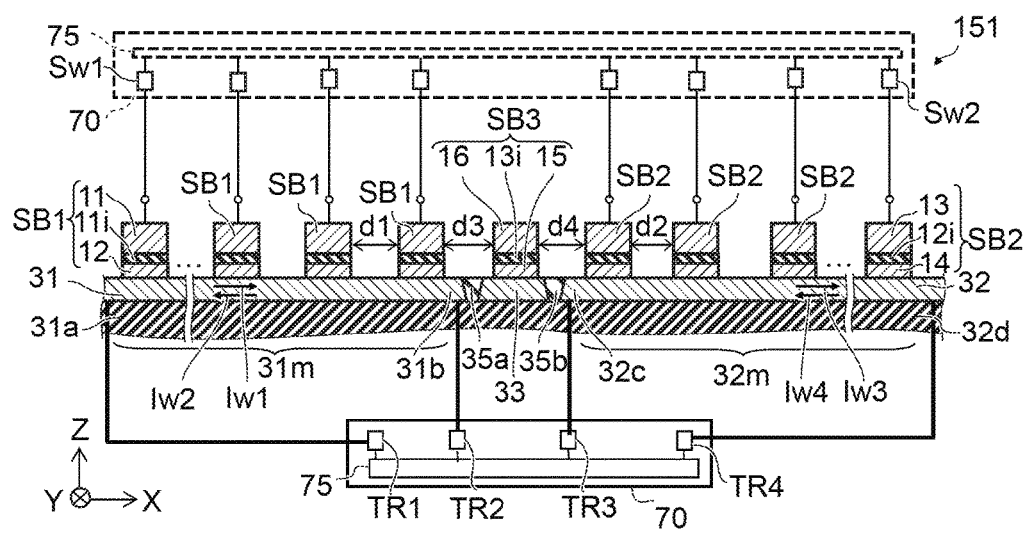
FIG. 18 is a schematic view illustrating a magnetic memory device according to a fifth embodiment.

FIG. 18 is a schematic view illustrating a magnetic memory device according to a fifth embodiment.

As shown in FIG. 18, the magnetic memory device 151 according to the embodiment includes a first metal-containing layer 31, a second metal-containing layer 32, the multiple first stacked bodies SB1, the multiple second stacked bodies SB2, a third stacked body SB3, and the controller 70.

The first metal-containing layer 31 includes a first portion 31a, a second portion 31b, and a first intervening portion 31m. The first intervening portion 31m is provided between the first portion 31a and the second portion 31b.

The second metal-containing layer 32 includes a third portion 32c, a fourth portion 32d, and a second intervening portion 32m. The second intervening portion 32m is provided between the third portion 32c and the fourth portion 32d. The second portion 31b is provided between the first portion 31a and the fourth portion 32d. The third portion 32c is provided between the second portion 31b and the fourth portion 32d.

In the example, the first metal-containing layer 31 and the second metal-containing layer 32 are provided on the base member 20s.

The multiple first stacked bodies SB1 are arranged along the first metal-containing layer 31. One of the multiple first stacked bodies SB1 includes the first magnetic layer 11, the second magnetic layer 12, and the first intermediate layer 11i. The first magnetic layer 11 is separated from the first intervening portion 31m in the first direction (e.g., the Z-axis direction). The second magnetic layer 12 is provided between the first intervening portion 31m and the first magnetic layer 11. The first intermediate layer 11i includes a portion provided between the first magnetic layer 11 and the second magnetic layer 12. The first intermediate layer 11i is nonmagnetic. In the first metal-containing layer 31, the direction from the first portion 31a toward the second portion 31b is taken as the second direction (e.g., the X-axis direction). The first direction (e.g., the Z-axis direction)

recited above crosses the second direction. Each of the multiple first stacked bodies SB1 has a configuration including the first magnetic layer 11, the second magnetic layer 12, and the first intermediate layer 11i recited above. For example, the second magnetic layer 12 contacts the first metal-containing layer 31.

The multiple second stacked bodies SB2 are arranged along the second metal-containing layer 32. One of the multiple second stacked bodies SB2 includes the third magnetic layer 13, the fourth magnetic layer 14, and the second intermediate layer 12i. The third magnetic layer 13 is separated from the second intervening portion 32m in the first direction (the Z-axis direction). The fourth magnetic layer 14 is provided between the second intervening portion 32m and the third magnetic layer 13. The second intermediate layer 12i includes a portion provided between the third magnetic layer 13 and the fourth magnetic layer 14. The second intermediate layer 12i is nonmagnetic. Each of the multiple second stacked bodies SB2 has a configuration including the third magnetic layer 13, the fourth magnetic layer 14, and the second intermediate layer 12i recited above. For example, the fourth magnetic layer 14 contacts the second metal-containing layer 32.

The third stacked body SB3 is provided between the multiple first stacked bodies SB1 and the multiple second stacked bodies SB2. The third stacked body SB3 includes a fifth magnetic layer 15.

For example, the fifth magnetic layer 15 is arranged with the second magnetic layer 12 and the fourth magnetic layer 14 inside the X-Y plane (a plane perpendicular to the first direction). For example, the fifth magnetic layer 15 includes a material included in at least one of the second magnetic layer 12 or the fourth magnetic layer 14.

In the example, the third stacked body SB3 further includes a sixth magnetic layer 16 and a third intermediate layer 13i. The sixth magnetic layer 16 is arranged with the first magnetic layer 11 and the third magnetic layer 13 in the plane (the X-Y plane) recited above. The third intermediate layer 13i is arranged with the first intermediate layer 11i and the second intermediate layer 12i in the plane recited above. In the embodiment, at least one of the sixth magnetic layer 16 or the third intermediate layer 13i may be omitted.

The controller 70 is electrically connected with the first portion 31a, the second portion 31b, the third portion 32c, the fourth portion 32d, the multiple first stacked bodies SB1, and the multiple second stacked bodies SB2. In the drawing, the controller 70 is drawn as being divided into two for easier viewing of the drawing.

In the example, the first switch elements Sw1 are provided respectively between the drive circuit 75 and the multiple first stacked bodies SB1. The second switch elements Sw2 are provided respectively between the drive circuit 75 and the multiple second stacked bodies SB2. The first transistor TR1 is provided between the first portion 31a and the drive circuit 75. The second transistor TR2 is provided between the second portion 31b and the drive circuit 75. The third transistor TR3 is provided between the third portion 32c and the drive circuit 75. A fourth transistor TR4 is provided between the fourth portion 32d and the drive circuit 75.

In the first program operation, the controller 70 forms the first state by supplying, to the first metal-containing layer 31, the first program current Iw1 from the first portion 31a toward the second portion 31b. In the second program operation, the controller 70 forms the second state by supplying, to the first metal-containing layer 31, the second program current Iw2 from the second portion 31b toward the first portion 31a. The first electrical resistance between the first magnetic layer 11 and one of the first portion 31a or the second portion 31b in the first state is different from the second electrical resistance between the first magnetic layer 11 and one of the first portion 31a or the second portion 31b recited above in the second state.

In the third program operation, the controller 70 forms the third state by supplying, to the second metal-containing layer 32, a third program current Iw3 from the third portion 32c toward the fourth portion 32d. In the fourth program operation, the controller 70 forms the fourth state by supplying, to the second metal-containing layer 32, a fourth program current Iw4 from the fourth portion 32d toward the third portion 32c. The third electrical resistance between the third magnetic layer 13 and one of the third portion 32c or the fourth portion 32d in the third state is different from the fourth electrical resistance between the third magnetic layer 13 and the one of the third portion 32c or the fourth portion 32d in the second state.

For example, the selection of the multiple first stacked bodies SB1 is controlled by the voltages applied to the first magnetic layers 11 included in the multiple first stacked bodies SB1.

For example, the controller 70 is electrically connected with the first magnetic layer 11 included in each of the multiple first stacked bodies SB1. In the first and second program operations, the controller 70 sets the potential of the first magnetic layer 11 included in one of the multiple first stacked bodies SB1 to a potential (e.g., the select potential) that is different from the potential (e.g., the unselect potential) of the first magnetic layer 11 included in one other of the multiple first stacked bodies SB1.

For example, the controller 70 is electrically connected with the third magnetic layers 13 included in the multiple second stacked bodies SB2. In the third and fourth program operations, the controller 70 sets the potential of the third magnetic layer 13 included in one of the multiple second stacked bodies SB2 to a potential (e.g., the select potential) that is different from the potential (e.g., the unselect potential) of the third magnetic layer 13 included in one other of the multiple second stacked bodies SB2.

In the magnetic memory device 151, for example, at least portions of the configurations described in reference to the metal-containing layer 21 of the magnetic memory devices 110, 120, etc., are applicable to the first metal-containing layer 31 and the second metal-containing layer 32. In the magnetic memory device 151, for example, at least portions of the configurations described in reference to the first stacked body SB1 of the magnetic memory devices 110, 120, etc., are applicable to the multiple first stacked bodies SB1 and the multiple second stacked bodies SB2. In the magnetic memory device 151, for example, at least portions of the configurations described in reference to the magnetic memory devices 110 and 120 are applicable to the controller 70.

The first metal-containing layer 31 and the multiple first stacked bodies SB1 form one memory column (memory string). The second metal-containing layer 32 and the multiple second stacked bodies SB2 form one other memory column (memory string).

The third stacked body SB3 is provided between these memory portions. For example, the controller 70 is electrically insulated from the fifth magnetic layer 15 of the third stacked body SB3. The third stacked body SB3 is not used as a memory portion. For example, the third stacked body SB3 functions as a dummy element.

For example, the multiple first stacked bodies SB1 include stacked bodies (end stacked bodies) positioned at the ends of the multiple first stacked bodies SB1, and stacked bodies (center stacked bodies) positioned at the central portion of the multiple first stacked bodies SB1. Other stacked bodies exist at the two sides of the center stacked bodies. One of the center stacked bodies is affected by another stacked body (e.g., one stacked body) provided on each of the two sides of the one of the center stacked bodies. On the other hand, in a reference example in which the third stacked body SB3 is not provided, the other stacked body does not exist at one of the end stacked bodies. An effect arises from the stacked body provided on one side of the end stacked body. Therefore, in the reference example, there are cases where the characteristics of the end stacked bodies of the multiple first stacked bodies SB1 are different from those of the center stacked bodies.

In such a case, in the embodiment, the characteristics of the end stacked bodies approach the characteristics of the center stacked bodies by providing the third stacked body SB3. Thereby, for example, stable memory operations are possible. For example, the yield can be improved. For example, stable operations are obtained even when the size of each of the multiple stacked bodies SB0 is small. The bit density can be increased.

In the embodiment, a first distance d1 is the distance between two (the most proximal two) of the multiple first stacked bodies SB1. A second distance d2 is the distance between two (the most proximal two) of the multiple second stacked bodies SB2. For example, a third distance d3 between the third stacked body SB3 and one of the multiple first stacked bodies SB1 is substantially the first distance d1. For example, the third distance d3 is not less than 0.5 times and not more than 2 times the first distance d1. For example, a fourth distance d4 between the third stacked body SB3 and one of the multiple second stacked bodies SB2 is substantially the second distance d2. The fourth distance d4 is not less than 0.5 times and not more than 2 times the second distance d2.

By providing the third stacked body SB3 at the vicinity of one of the multiple first stacked bodies SB1, for example, stable operations are obtained easily for the one of the multiple first stacked bodies SB1. By providing the third stacked body SB3 at the vicinity of one of the multiple second stacked bodies SB2, for example, stable operations are obtained easily for the one of the multiple second stacked bodies SB2.

In the embodiment, the first metal-containing layer 31 and the second metal-containing layer 32 may be insulated from each other. The first metal-containing layer 31 and the second metal-containing layer 32 may be electrically connected with each other.

In the example, a third metal-containing layer 33 is provided between the first metal-containing layer 31 and the second metal-containing layer 32. The third metal-containing layer 33 also is provided on the base member 20s. The third metal-containing layer 33 is provided between the second portion 31b of the first metal-containing layer 31 and the third portion 32c of the second metal-containing layer 32. For example, the third metal-containing layer 33 includes a material of the first metal-containing layer 31.

A first insulating region 35a and a second insulating region 35b are provided in the example. The first insulating region 35a is provided between the second portion 31b and the third metal-containing layer 33. The first insulating region 35a electrically insulates between the second portion 31b and the third metal-containing layer 33. The second insulating region 35b is provided between the third portion 32c and the third metal-containing layer 33. The second insulating region 35b electrically insulates between the third portion 32c and the third metal-containing layer 33. The first insulating region 35a may include one of an oxide of the first metal included in the first metal-containing layer 31, a nitride of the first metal, or an oxynitride of the first metal.

An example of the method for manufacturing the magnetic memory device 151 will now be described.

Figure 19A:
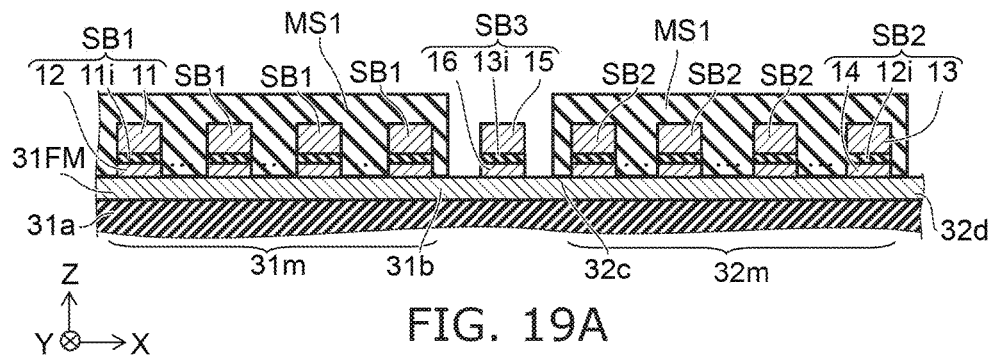
FIG. 19A and FIG. 19B are schematic cross-sectional views illustrating a method for manufacturing the magnetic memory device according to the fifth embodiment.
Figure 19B:
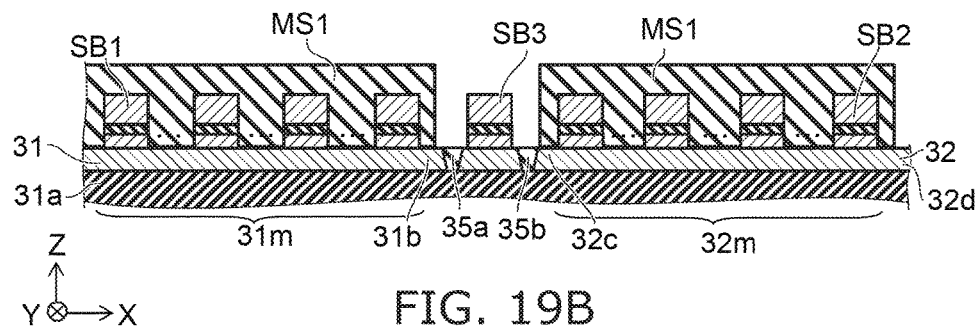

FIG. 19A and FIG. 19B are schematic cross-sectional views illustrating the method for manufacturing the magnetic memory device according to the fifth embodiment.

As shown in FIG. 19A, a metal-containing film 31FM is provided on the base member 20s. A portion of the metal-containing film 31FM is used to form the first metal-containing layer 31; and another portion of the metal-containing film 31FM is used to form the second metal-containing layer 32. The multiple first stacked bodies SB1 are provided on a portion of the metal-containing film 31FM. The multiple second stacked bodies SB2 are provided on another portion of the metal-containing film 31FM. The third stacked body SB3 is provided on the metal-containing film 31FM. A mask MS1 is provided on the multiple first stacked bodies SB1 and the multiple second stacked bodies SB2. The third stacked body SB3 is not covered with the mask MS1. The metal-containing film 31FM includes a portion positioned between the third stacked body SB3 and the multiple first stacked bodies SB1 in a direction along the X-Y plane. This portion is not covered with the mask MS1. The metal-containing film 31FM includes a portion positioned between the third stacked body SB3 and the multiple second stacked bodies SB2 in a direction along the X-Y plane. This portion is not covered with the mask MS1.

As shown in FIG. 19B, processing of the patterning body including the metal-containing film 31FM, the multiple first stacked bodies SB1, the multiple second stacked bodies SB2, and the third stacked body SB3 is performed. The processing includes at least one of etching, oxidation treatment, or ion beam irradiation. For example, in the etching, the portion of the metal-containing film 31FM not covered with the mask MS1 is removed. For example, in the oxidation treatment, the portion of the metal-containing film 31FM not covered with the mask MS1 is oxidized. The oxidized portion is used to form the insulating portions. For example, in the ion beam irradiation, the portion of the metal-containing film 31FM not covered with the mask MS1 is removed. For example, in the ion beam irradiation, a compound may be produced from the portion of the metal-containing film 31FM not covered with the mask MS1. The compound includes, for example, at least one of an oxide of the metal included in the metal-containing film 31FM, a nitride of the metal, or an oxynitride of the metal.

For example, in the case where at least one of oxidation treatment or ion beam irradiation is implemented, a compound is formed from the metal-containing film 31FM. The compound is used to form the first insulating region 35a and the second insulating region 35b.

The magnetic memory device 151 is formed by such processing. At least a portion of the stacked body SB3 may be changed before and after the processing recited above. In the case where the sixth magnetic layer 16 exists before the processing recited above, the sixth magnetic layer 16 may be changed by the processing recited above. The sixth magnetic layer 16 may be removed.

Figure 20:
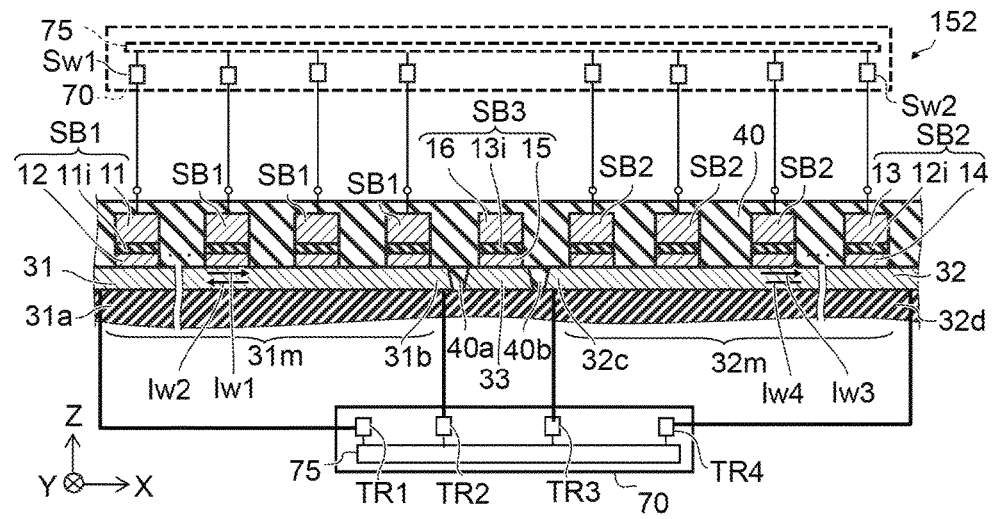
FIG. 20 is a schematic view illustrating another magnetic memory device according to the fifth embodiment.

FIG. 20 is a schematic view illustrating another magnetic memory device according to the fifth embodiment.

As shown in FIG. 20, the magnetic memory device 152 according to the embodiment also includes the first metal-containing layer 31, the second metal-containing layer 32, the multiple first stacked bodies SB1, the multiple second stacked bodies SB2, the third stacked body SB3, and the controller 70. The insulating portion 40 is provided in the magnetic memory device 152. The insulating portion 40 is provided around the multiple first stacked bodies SB1, the multiple second stacked bodies SB2, and the third stacked body SB3. The insulating portion 40 is, for example, an inter-layer insulating film.

A first insulating region 40a and a second insulating region 40b are provided in the magnetic memory device 152. The first insulating region 40a and the second insulating region 40b include, for example, the same material as a material included in the insulating portion 40.

For example, in the processing described in reference to FIG. 19B, for example, etching is performed; and a portion of the metal-containing film 31FM is removed. A recess is formed in the removed portion. The recess is filled with a material used to form the insulating portion 40. Thereby, the first insulating region 40a and the second insulating region 40b are formed.

In the magnetic memory device 152 as well, for example, stable memory operations are possible. For example, the yield can be improved. For example, stable operations are obtained easily even when the size of each of the multiple stacked bodies SB0 is small. The bit density can be increased.

According to the embodiments, a magnetic memory device and a method for manufacturing the magnetic memory device can be provided in which the bit density can be increased.

In this specification, the "state of being electrically connected" includes the state in which multiple conductive bodies are physically in contact, and a current flows between these multiple conductive bodies. The "state of being electrically connected" includes the state in which another conductive body is inserted between the multiple conductive bodies, and a current flows between these multiple conductive bodies. The "state of being electrically connected" includes the state in which an electrical element (a switch element such as a transistor or the like) is inserted between multiple conductive bodies so that a state in which a current flows between these multiple conductive bodies is formable.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as metal-containing layers, magnetic layers, intermediate layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices and methods for manufacturing the same practicable by an appropriate design modification by one skilled in the art based on the magnetic memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a metal-containing layer including a first portion, a second portion, a third portion located between the first portion and the second portion, a fourth portion located between the third portion and the second portion, and a fifth portion located between the third portion and the fourth portion, each of the first, second, third, fourth, and fifth portions extending through an entirety of the metal-containing layer in a third direction;
a first magnetic layer separated from the third portion in a first direction crossing a second direction, the second direction being from the first portion toward the second portion;
a second magnetic layer provided between the first magnetic layer and a portion of the third portion;
a first intermediate layer including a portion provided between the first magnetic layer and the second magnetic layer, the first intermediate layer being nonmagnetic;
a third magnetic layer separated from the fourth portion in the first direction;
a fourth magnetic layer provided between the third magnetic layer and a portion of the fourth portion;
a second intermediate layer including a portion provided between the third magnetic layer and the fourth magnetic layer, the second intermediate layer being non-magnetic; and
a controller electrically connected with the first portion and the second portion,
a length along the third direction of the third portion being longer than a length along the third direction of the second magnetic layer, the third direction crossing a plane including the first direction and the second direction,
the length along the third direction of the third portion being longer than a length along the third direction of the fifth portion,
the controller being configured to implement:
a first program operation of supplying a first program current from the first portion toward the second portion; and
a second program operation of supplying a second program current from the second portion toward the first portion,
a first electrical resistance between the first magnetic layer and the first portion after the first program operation being different from a second electrical resistance between the first magnetic layer and the first portion after the second program operation.

2. The device according to claim 1, wherein
a length along the third direction of the fourth portion is longer than a length along the third direction of the fourth magnetic layer, and
the length of the fourth portion is longer than the length of the fifth portion.

3. The device according to claim 1, wherein
the third portion includes:
  a first overlap region overlapping the second magnetic layer in the first direction; and
  a first non-overlap region not overlapping the second magnetic layer in the first direction, and
a thickness along the first direction of at least a portion of the first non-overlap region is thinner than a first overlap region thickness along the first direction of the first overlap region.

4. The device according to claim 3, wherein
the third portion further includes a second non-overlap region,
the second non-overlap region does not overlap the second magnetic layer in the first direction,
the first overlap region is positioned between the first non-overlap region and the second non-overlap region in the third direction, and
the thickness along the first direction of at least a portion of the second non-overlap region is thinner than the first overlap region thickness.

5. The device according to claim 4, wherein a first ratio of a total of a length along the third direction of the first non-overlap region and a length along the third direction of the second non-overlap region to the first overlap region thickness is higher than a ratio of an absolute value of a difference between a length along the second direction of a surface of the second magnetic layer opposing the metal-containing layer and a length along the second direction of a surface of the second magnetic layer opposing the first intermediate layer to a thickness along the first direction of the second magnetic layer.

6. The device according to claim 1, wherein
the third portion includes a first overlap region overlapping the second magnetic layer in the first direction, and
a thickness along the first direction of the fifth portion is thinner than a first overlap region thickness along the first direction of the first overlap region.

7. The device according to claim 1, wherein
the controller is further electrically connected with the first magnetic layer and the third magnetic layer, and
the controller in the first program operation sets the first magnetic layer to a potential different from a potential of the third magnetic layer.

8. The device according to claim 1, further comprising a compound region, the compound region including a metal included in the second magnetic layer,
the compound region being provided along a direction connecting the second magnetic layer and the fourth magnetic layer between the second magnetic layer and the fourth magnetic layer.

9. The device according to claim 1, wherein a crystal structure of the third portion is different from a crystal structure of at least a portion of the fifth portion.

10. A magnetic memory device, comprising:
a metal-containing layer including a first portion, a second portion, and a third portion located between the first portion and the second portion, each of the first, second, and third portions extending through an entirety of the metal-containing layer in a third direction;
a first magnetic layer separated from the third portion in a first direction crossing a second direction, the second direction being from the first portion toward the second portion;
a second magnetic layer provided between the first magnetic layer and a portion of the third portion;
a first intermediate layer including a portion provided between the first magnetic layer and the second magnetic layer, the first intermediate layer being nonmagnetic; and
a controller electrically connected with the first portion and the second portion,
a length along the third direction of the third portion being longer than a length along the third direction of the second magnetic layer, the third direction crossing a plane including the first direction and the second direction,
the length along the third direction of the third portion being longer than a length along the third direction of a portion between the third portion and the second portion,
the controller being configured to implement:
  a first program operation of supplying a first program current from the first portion toward the second portion; and
  a second program operation of supplying a second program current from the second portion toward the first portion,
a first electrical resistance between the first magnetic layer and one of the first portion or the second portion after the first program operation being different from a second electrical resistance between the first magnetic layer and the one of the first portion or the second portion after the second program operation.

11. A magnetic memory device, comprising:
a metal-containing layer including a first portion, a second portion, and a third portion located between the first portion and the second portion;
a first magnetic layer separated from the third portion in a first direction crossing a second direction, the second direction being from the first portion toward the second portion;
a second magnetic layer provided between the first magnetic layer and a portion of the third portion;
a first intermediate layer including a portion provided between the first magnetic layer and the second magnetic layer, the first intermediate layer being nonmagnetic; and
a controller electrically connected with the first portion and the second portion,
the third portion including:
  a first overlap region overlapping the second magnetic layer in the first direction; and
  a first non-overlap region not overlapping the second magnetic layer in the first direction,
a thickness along the first direction of at least a portion of the first non-overlap region being thinner than a first overlap region thickness along the first direction of the first overlap region,
the controller being configured to implement:
  a first program operation of supplying a first program current from the first portion toward the second portion; and a second program operation of supplying a second program current from the second portion toward the first portion,
a first electrical resistance between the first magnetic layer and the first portion after the first program operation being different from a second electrical resistance between the first magnetic layer and the first portion after the second program operation.

12. The device according to claim 11, wherein
the third portion further includes a second non-overlap region,
the second non-overlap region does not overlap the second magnetic layer in the first direction,
the first overlap region is positioned between the first non-overlap region and the second non-overlap region in a third direction crossing a plane including the first direction and the second direction, and
a thickness along the first direction of at least a portion of the second non-overlap region is thinner than the first overlap region thickness.

13. The device according to claim 12, wherein a first ratio of a total of a length along the third direction of the first non-overlap region and a length along the third direction of the second non-overlap region to the first overlap region thickness is higher than a ratio of an absolute value of a difference between a length along the second direction of a surface of the second magnetic layer opposing the metal-containing layer and a length along the second direction of a surface of the second magnetic layer opposing the first intermediate layer to a thickness along the first direction of the second magnetic layer.

14. The device according to claim 13, wherein the first ratio is higher than a ratio of an absolute value of a difference between a length along the third direction of the surface of the second magnetic layer opposing the metal-containing layer and a length along the third direction of the surface of the second magnetic layer opposing the first intermediate layer to the thickness along the first direction of the second magnetic layer.

15. The device according to claim 11, further comprising:
a third magnetic layer;
a fourth magnetic layer; and
a second inter mediate layer, the second intermediate layer being nonmagnetic,
the metal-containing layer further including a fourth portion located between the third portion and the second portion, and a fifth portion located between the third portion and the fourth portion,
the third magnetic layer being separated from the fourth portion in the first direction,
the fourth magnetic layer being provided between the third magnetic layer and a portion of the fourth portion,
the second intermediate layer including a portion provided between the third magnetic layer and the fourth magnetic layer,
a thickness along the first direction of the fifth portion being thinner than the first overlap region thickness.

16. A magnetic memory device, comprising:
a first metal-containing layer including a first portion, a second portion, and a first intervening portion provided between the first portion and the second portion;
a second metal-containing layer including a third portion, a fourth portion, and a second intervening portion provided between the third portion and the fourth portion, the second portion being provided between the first portion and the fourth portion, the third portion being provided between the second portion and the fourth portion; and
a plurality of first stacked bodies, the first stacked bodies being arranged along the first metal-containing layer, one of the first stacked bodies including a first magnetic layer, a second magnetic layer, and a first intermediate layer, the first magnetic layer being separated from the first intervening portion in a first direction crossing a second direction, the second direction being from the first portion toward the second portion, the second magnetic layer being provided between the first intervening portion and the first magnetic layer, the first intermediate layer being nonmagnetic and including a portion provided between the first magnetic layer and the second magnetic layer;
a plurality of second stacked bodies, the second stacked bodies being arranged along the second metal-containing layer, one of the second stacked bodies including a third magnetic layer, a fourth magnetic layer, and a second intermediate layer, the third magnetic layer being separated from the second intervening portion in the first direction, the fourth magnetic layer being provided between the second intervening portion and the third magnetic layer, the second intermediate layer being nonmagnetic and including a portion provided between the third magnetic layer and the fourth magnetic layer;
a third stacked body including a fifth magnetic layer and being provided between the first stacked bodies and the second stacked bodies; and
a controller electrically connected with the first to fourth portions, the first stacked bodies, and the second stacked bodies,
the controller being configured to implement:
a first program operation of supplying a first program current from the first portion toward the second portion; and
a second program operation of supplying a second program current from the second portion toward the first portion,
a first electrical resistance between the first magnetic layer and one of the first portion or the second portion after the first program operation being different from a second electrical resistance between the first magnetic layer and the one of the first portion or the second portion after the second program operation,
the controller being configured to implement:
a third program operation of supplying a third program current from the third portion toward the fourth portion; and
a fourth program operation of supplying a fourth program current from the fourth portion toward the third portion,
a third electrical resistance between the third magnetic layer and one of the third portion or the fourth portion after the third program operation being different from a fourth electrical resistance between the third magnetic layer and the one of the third portion or the fourth portion after the second program operation.

17. The device according to claim 16, further comprising:
a third metal-containing layer provided between the second portion and the third portion;
a first insulating region provided between the second portion and the third metal-containing layer; and
a second insulating region provided between the third portion and the third metal-containing layer.

18. The device according to claim 16, wherein
the controller is further electrically connected with the first magnetic layer of each of the first stacked bodies, and
the controller in the first program operation sets a potential of the first magnetic layer included in the one of the first stacked bodies to a potential different from a potential of the first magnetic layer included in one other of the first stacked bodies.

19. A magnetic memory device, comprising:
a metal-containing layer including a first portion, a second portion, a third portion located between the first portion and the second portion, a fourth portion located between the third portion and the second portion, and a fifth portion located between the third portion and the fourth portion;
a first magnetic layer separated from the third portion in a first direction crossing a second direction, the second direction being from the first portion toward the second portion;
a second magnetic layer provided between the first magnetic layer and a portion of the third portion;
a first intermediate layer including a portion provided between the first magnetic layer and the second magnetic layer, the first intermediate layer being nonmagnetic;
a third magnetic layer separated from the fourth portion in the first direction;
a fourth magnetic layer provided between the third magnetic layer and a portion of the fourth portion;
a second intermediate layer including a portion provided between the third magnetic layer and the fourth magnetic layer, the second intermediate layer being nonmagnetic; and
a controller electrically connected with the first portion and the second portion,
a length along a third direction of the third portion being longer than a length along the third direction of the second magnetic layer, the third direction crossing a plane including the first direction and the second direction,
the length along the third direction of the third portion being longer than a length along the third direction of the fifth portion,
the controller being configured to implement:
a first program operation of supplying a first program current from the first portion toward the second portion; and
a second program operation of supplying a second program current from the second portion toward the first portion,
a first electrical resistance between the first magnetic layer and the first portion after the first program operation being different from a second electrical resistance between the first magnetic layer and the first portion after the second program operation,
wherein the third portion includes a first overlap region overlapping the second magnetic layer in the first direction, and
a thickness along the first direction of the fifth portion is thinner than a first overlap region thickness along the first direction of the first overlap region.

20. The device according to claim 19, wherein
the third portion further includes a second non-overlap region,
the second non-overlap region does not overlap the second magnetic layer in the first direction,
the first overlap region is positioned between the first non-overlap region and the second non-overlap region in the third direction, and
the thickness along the first direction of at least a portion of the second non-overlap region is thinner than the first overlap region thickness.

21. The device according to claim 20, wherein a first ratio of a total of a length along the third direction of the first non-overlap region and a length along the third direction of the second non-overlap region to the first overlap region thickness is higher than a ratio of an absolute value of a difference between a length along the second direction of a surface of the second magnetic layer opposing the metal-containing layer and a length along the second direction of a surface of the second magnetic layer opposing the first intermediate layer to a thickness along the first direction of the second magnetic layer.

* * * * *